United States Patent
Lim et al.

(10) Patent No.: US 12,513,955 B2
(45) Date of Patent: Dec. 30, 2025

(54) TRANSISTORS HAVING DIFFERENT CHANNEL LENGTHS AND COMPARABLE SOURCE/DRAIN SPACES

(71) Applicant: QUALCOMM Incorporated, San Diego, CA (US)

(72) Inventors: Kwanyong Lim, San Diego, CA (US); Hyunwoo Park, San Diego, CA (US); Junjing Bao, San Diego, CA (US); Haining Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 410 days.

(21) Appl. No.: 18/178,248

(22) Filed: Mar. 3, 2023

(65) Prior Publication Data

US 2024/0297218 A1   Sep. 5, 2024

(51) Int. Cl.
*H01L 29/06* (2006.01)
*H01L 21/8234* (2006.01)
(Continued)

(52) U.S. Cl.
CPC ......... *H10D 62/121* (2025.01); *H10D 30/014* (2025.01); *H10D 30/024* (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119;
(Continued)

(56) References Cited

U.S. PATENT DOCUMENTS

| 10,367,061 B1 | 7/2019 | Loubet | |
|---|---|---|---|
| 2019/0181140 A1* | 6/2019 | Rodder | B82Y 10/00 |

(Continued)

FOREIGN PATENT DOCUMENTS

TW   I770789 B   7/2022

OTHER PUBLICATIONS

International Search Report and Written Opinion—PCT/US2024/016233—ISA/EPO—Jun. 7, 2024.
(Continued)

*Primary Examiner* — David C Spalla
(74) *Attorney, Agent, or Firm* — Muncy, Geissler, Olds & Lowe, P.C.

(57) ABSTRACT

Disclosed are techniques for a semiconductor structure. In an aspect, a semiconductor structure includes a first gate structure disposed on a substrate and having a first channel length; a second gate structure disposed on the substrate and having the first channel length, a first source/drain space between the first gate structure and the second gate structure having a first distance; a third gate structure disposed on the substrate and having a second channel length; and a fourth gate structure disposed on the substrate and having the second channel length, a second source/drain space between the third gate structure and the fourth gate structure having a second distance. In an aspect, the second distance ranges from 0.75 times to 1.25 times the first distance.

23 Claims, 11 Drawing Sheets

(51) Int. Cl.
*H01L 29/08* (2006.01)
*H01L 29/423* (2006.01)
*H01L 29/66* (2006.01)
*H01L 29/775* (2006.01)
*H01L 29/78* (2006.01)
*H01L 29/786* (2006.01)
*H10D 30/01* (2025.01)
*H10D 30/43* (2025.01)
*H10D 30/62* (2025.01)
*H10D 30/67* (2025.01)
*H10D 62/10* (2025.01)
*H10D 62/13* (2025.01)
*H10D 84/01* (2025.01)
*H10D 84/03* (2025.01)

(52) U.S. Cl.
CPC ......... *H10D 30/43* (2025.01); *H10D 30/6211* (2025.01); *H10D 30/6735* (2025.01); *H10D 30/6757* (2025.01); *H10D 62/151* (2025.01); *H10D 84/0128* (2025.01); *H10D 84/013* (2025.01); *H10D 84/038* (2025.01)

(58) Field of Classification Search
CPC .. H10D 62/121; H10D 62/149; H10D 62/151; H10D 84/0128; H10D 84/013; H10D 84/0158; H10D 84/017; H10D 84/0193; H10D 84/038; H10D 84/834; H10D 84/853

See application file for complete search history.

(56) References Cited

U.S. PATENT DOCUMENTS

| | | | |
|---|---|---|---|
| 2020/0350215 A1* | 11/2020 | Zhang | H10D 62/40 |
| 2020/0352015 A1* | 11/2020 | Jegou | H05G 1/52 |
| 2021/0098302 A1* | 4/2021 | Ju | H10D 84/0151 |
| 2022/0310602 A1 | 9/2022 | Greene et al. | |
| 2022/0375944 A1* | 11/2022 | Lin | H10D 62/151 |
| 2024/0096886 A1* | 3/2024 | Cheng | H10D 64/514 |

OTHER PUBLICATIONS

Loubet N., et al., "Stacked Nanosheet Gate-All-Around Transistor to Enable Scaling Beyond FinFET", Symposium on VLSI Technology Digest of Technical Papers, 2017, 2 Pages.

* cited by examiner

TRANSISTORS HAVING DIFFERENT CHANNEL LENGTHS AND COMPARABLE SOURCE/DRAIN SPACES

TECHNICAL FIELD

The present disclosure generally relates to semiconductor structures, and more particularly, to a semiconductor structure that includes multiple transistors having different channel lengths and comparable source/drain spaces.

BACKGROUND

Integrated circuit (IC) technology has achieved great strides in advancing computing capabilities through miniaturization and modification of semiconductor components such as transistors. For example, the progression of the transistors has progressed from bulk substrates and planar metal-oxide-semiconductor field-effect transistors (MOSFETs), to three-dimensional stacking transistors such as fin field-effect transistors (FinFETs) or gate-all-around (GAA) transistors (e.g., nanowire field-effect transistors (FETs) or nanosheet FETs). Also, the technology nodes of semiconductor manufacturing processes have evolved from 14 nanometers (nm), 10 nm, 7 nm, to 3 nm and beyond. To form various elements of the semiconductor components at the reduced sizes, advanced lithographic processes are introduced with enhanced spatial resolutions. However, due to diffraction and/or other optical effects or interferences, even for a same lithographic process, patterns with different sizes and/or spaces may be subject to different design rules. Accordingly, the minimum spaces between patterns formed using a lithographic process may vary based on the sizes of the patterns.

Therefore, there is a need for an improved manufacturing process for forming a space between two elements that is smaller than the minimum space allowable by the design rules of a particular lithographic process, in order to further reduce the size of the semiconductor components and/or achieve improved characteristics in the manufacturing process (e.g., an improved IC performance, a new or improved element or component configuration, a higher yield rate, a higher throughput, etc.).

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a semiconductor structure includes a first gate structure disposed on a substrate and having a first channel length along a first direction; a second gate structure disposed on the substrate and having the first channel length along the first direction, a first source/drain space between the first gate structure and the second gate structure having a first distance along the first direction; a third gate structure disposed on the substrate and having a second channel length along the first direction; and a fourth gate structure disposed on the substrate and having the second channel length along the first direction, a second source/drain space between the third gate structure and the fourth gate structure having a second distance along the first direction, wherein the second channel length is different from the first channel length, and the second distance ranges from 0.75 times to 1.25 times the first distance.

In an aspect, a method of manufacturing a semiconductor structure includes forming a first gate structure disposed on a substrate and having a first channel length along a first direction; forming a second gate structure disposed on the substrate and having the first channel length along the first direction, a first source/drain space between the first gate structure and the second gate structure having a first distance along the first direction; forming a third gate structure disposed on the substrate and having a second channel length along the first direction; and forming a fourth gate structure disposed on the substrate and having the second channel length along the first direction, a second source/drain space between the third gate structure and the fourth gate structure having a second distance along the first direction, wherein the second channel length is different from the first channel length, and the second distance ranges from 0.75 times to 1.25 times the first distance.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Figure 1:
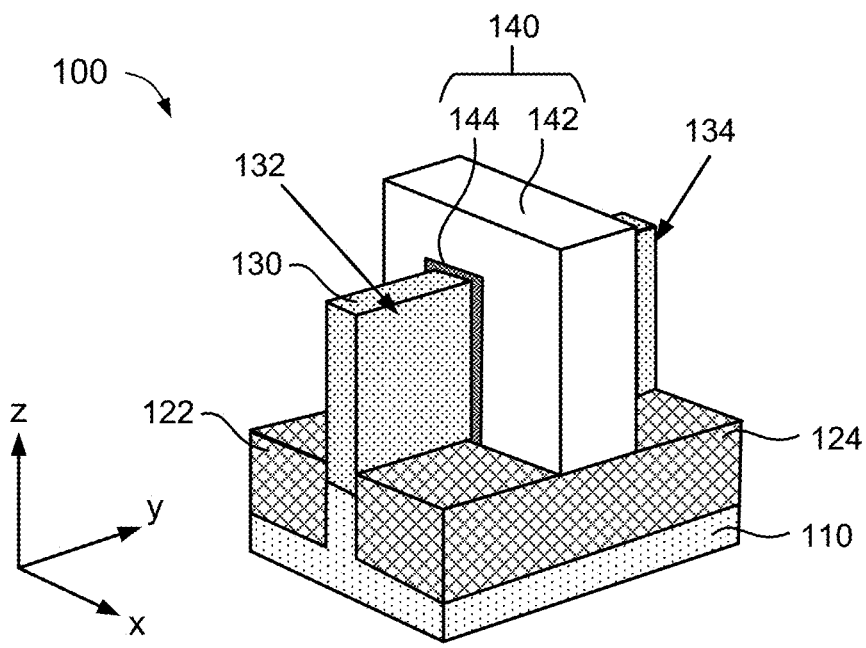
FIG. 1 illustrates a semiconductor structure including a FinFET, according to aspects of the disclosure.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

According to the present application, a method of forming a semiconductor structure that includes transistors having different channel lengths may include forming a plurality of mask patterns on an intermediate structure and forming a capping film covering a subset of the plurality of mask patterns. The spacing of the plurality of mask patterns may be subject to the limitations imposed by a lithographic process for patterning the plurality of mask patterns. However, the capping film covering the subset of the plurality of mask patterns may effectively function as expanded masking portion for the subset of the plurality of mask patterns. Accordingly, the spaces between the elements formed based on the subset of the plurality of mask patterns and the capping film may be effectively narrowed beyond the limitation of the lithographic process. In some aspects, the plurality of mask patterns and the capping film may define the sizes and positions of various gate structures of the to-be-formed transistors, and an epitaxial structure formed within a narrowed space may better bridge the channel structures associated with the gate structures on the opposite ends of the space.

FIG. 1 illustrates a semiconductor structure 100 including a FinFET, according to aspects of the disclosure. The semiconductor structure 100 shows a simplified example of a FinFET structure. In some aspects, the semiconductor structure 100 may be part of an IC. In some aspects, various elements of the FinFET may have shapes different from the example shown in FIG. 1, and other elements or configurations for the FinFET may be adopted in addition to the example shown in FIG. 1.

As shown in FIG. 1, the semiconductor structure 100 includes a substrate 110 and isolation structures 122 and 124 disposed on the substrate 110. A fin structure (or simply referred to as a fin in this disclosure) 130 is disposed on the substrate 110 between the isolation structures 122 and 124. A gate structure 140 is disposed on the fin 130 and the isolation structures 122 and 124. The gate structure 140 includes a gate conductor 142 and a gate dielectric 144 separating the fin 130 from the gate conductor 142. As shown in FIG. 1, the fin 130 generally extends along the y-z plane, and the gate structure 140 generally extends along the x-z plane. In some aspects, the isolation structures 122 and 124, the fin 130, and the gate structure 140 together define the FinFET. In some aspects, the fin 130 may include a portion 132 of the fin 130 on one side of the gate structure 140 configured as a first source/drain terminal, a portion 134 of the fin 130 on the other side of the gate structure 140 configured as a second source/drain terminal, and a central portion (not labeled) under the gate conductor 142 and between the portions 132 and 134 configured as a channel structure of the FinFET. In some aspects, the gate conductor 142 may be configured as the gate terminal of the FinFET.

In some aspects, the portion 132 and the portion 134 on both sides of the gate structure 140 may be wholly or partially removed, and then replaced with added source/drain structures. In some aspects, the gate structure 140 may include gate spacers (not shown) formed on the sidewalls of the gate conductor 142 and the gate dielectric 144 and separating the gate conductor 142 and the gate dielectric 144 from the added source/drain structures. Moreover, conductive structures (not shown) may be disposed on the gate structure 140, the portions 132 and 134, and/or the added source/drain structures, and additional metallization structures disposed over the FinFET may electrically connect to the FinFET through the conductive structures.

In some aspects, the isolation structures 122 and 124 may include $SiO_2$ and may be shallow trench isolation (STI) structures. In some aspects, the gate conductor 142 may include polysilicon or one or more layers of metallic materials. In some aspects, the gate dielectric 144 may include $SiO_2$ or a dielectric material that has a dielectric constant greater than that of $SiO_2$. In some aspects, when the FinFET is configured as an n-channel transistor, the central portion of the fin 130 may be p-doped and the portions 132 and 134 may be n-doped. In some aspects, when the FinFET is configured as a p-channel transistor, the central portion of fin 130 may be an n-doped fin and the portions 132 and 134 may be p-doped.

Figure 2:
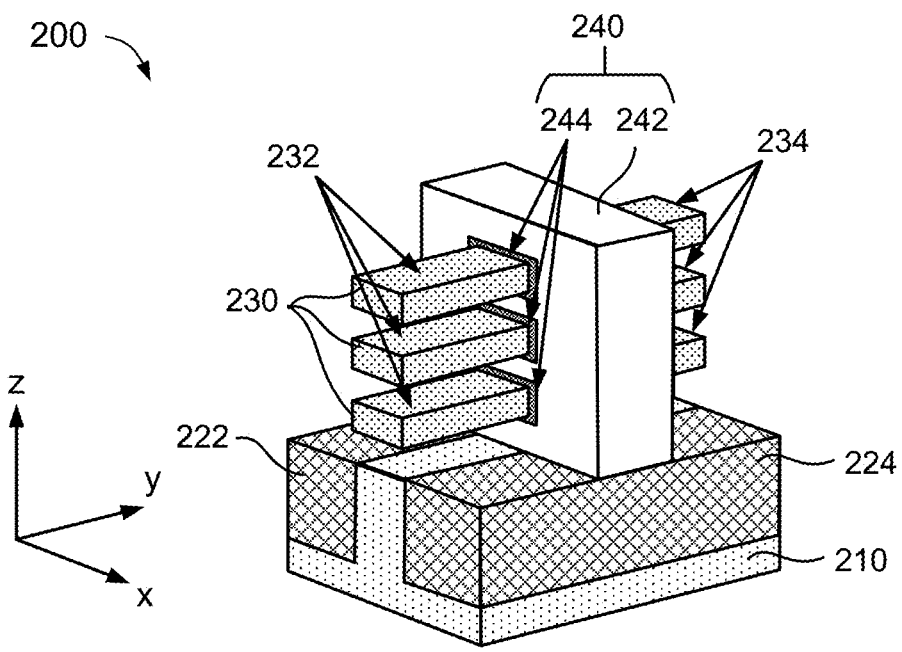
FIG. 2 illustrates a semiconductor structure including a nanosheet FET, according to aspects of the disclosure.

FIG. 2 illustrates a semiconductor structure 200 including a nanosheet FET, according to aspects of the disclosure. The semiconductor structure 200 shows a simplified example of a GAA structure, such as a nanosheet FET structure. In some aspects, the semiconductor structure 200 may be part of an IC. In some aspects, various elements of the nanosheet FET may have shapes different from the example shown in FIG. 2, and other elements or configurations for the nanosheet FET may be adopted in addition to the example shown in FIG. 2.

As shown in FIG. 2, the semiconductor structure 200 includes a substrate 210 and isolation structures 222 and 224 disposed on the substrate 210. A plurality of sheet structures (or also referred to as nanosheets in this disclosure) 230 are disposed over the substrate 210. A gate structure 240 is disposed on the isolation structures 222 and 224 and surrounding at least a central portion of the nanosheets 230. The gate structure 240 includes a gate conductor 242 and gate dielectrics 244 separating the nanosheets 230 from the gate conductor 242. As shown in FIG. 2, each one the nanosheets 230 generally extend along the x-y plane and stacked one over another along the z direction. Also, the gate structure 240 generally extends along the x-z plane. In some aspects, the isolation structures 222 and 224, the nanosheets 230 and the gate structure 240 together define the nanosheet FET. In some aspects, the nanosheets 230 may include a portion 232 of the nanosheets 230 on one side of the gate structure 240 configured as a first source/drain terminal, a portion 234 of the nanosheets 230 on the other side of the gate structure 240 configured as a second source/drain terminal, and the central portion (not labeled) wrapped around by the gate conductor 242 and between the portions 232 and 234 configured as a channel structure of the nanosheet FET. In some aspects, the gate conductor 242 may be configured as the gate terminal of the nanosheet FET.

In some aspects, the portion 232 and the portion 234 on both sides of the gate structure 240 may be wholly or partially removed, and then replaced with added source/drain structures. In some aspects, the gate structure 240 may include gate spacers (not shown) formed on the sidewalls of the gate conductor 242 and the gate dielectrics 244 and separating the gate conductor 242 and the gate dielectrics 244 from the added source/drain structures. Moreover, conductive structures (not shown) may be disposed on the gate structure 240, the portions 232 and 234, and/or the added source/drain structures, and additional metallization structures disposed over the nanosheet FET may electrically connect to the nanosheet FET through the conductive structures.

In some aspects, the isolation structures 222 and 224 may include $SiO_2$ and may be STI structures. In some aspects, the gate conductor 242 may include polysilicon or one or more layers of metallic materials. In some aspects, the gate dielectrics 244 may include $SiO_2$ or a dielectric material that has a dielectric constant greater than that of $SiO_2$. In some aspects, when the nanosheet FET is configured as an n-channel transistor, the central portion of the nanosheets 230 may be p-doped, and the portions 232 and 234 may be n-doped. In some aspects, when the nanosheet FET is configured as a p-channel transistor, the central portion of the nanosheets 230 may be n-doped nanosheets, and the portions 232 and 234 may be p-doped.

Figure 3A:
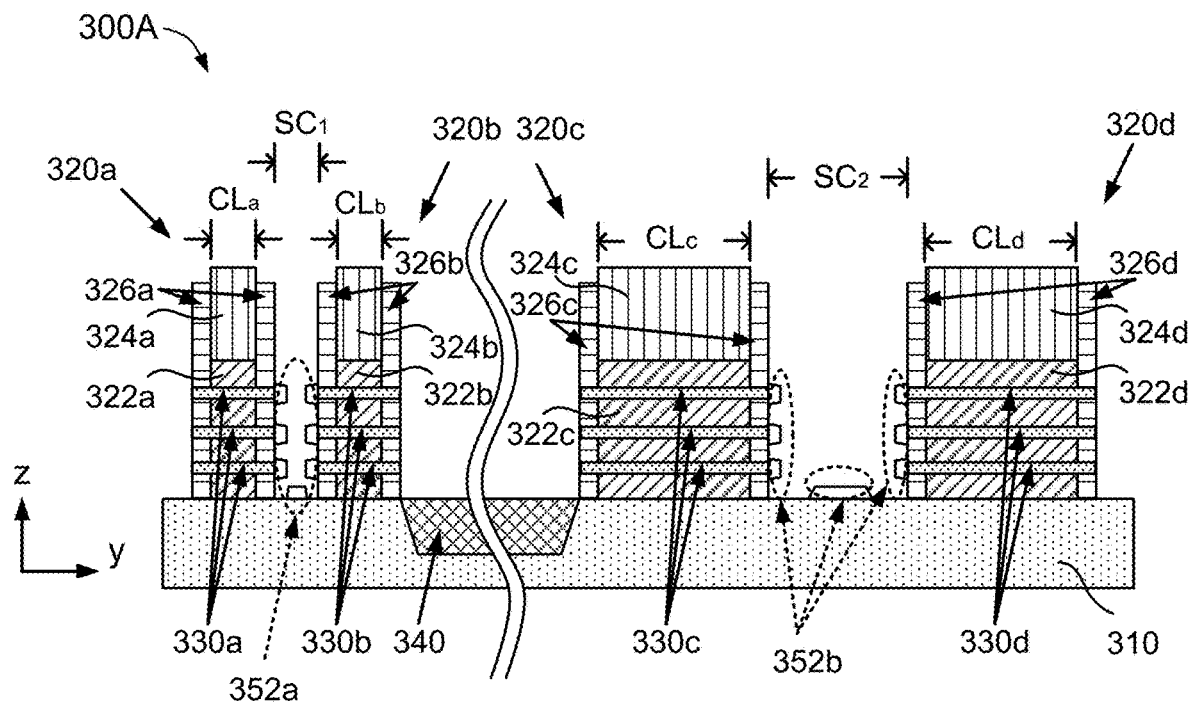
FIGS. 3A and 3B are cross-sectional views of semiconductor structures directed to a first example and including nanosheet FETs having different channel lengths, according to aspects of the disclosure.
Figure 3B:
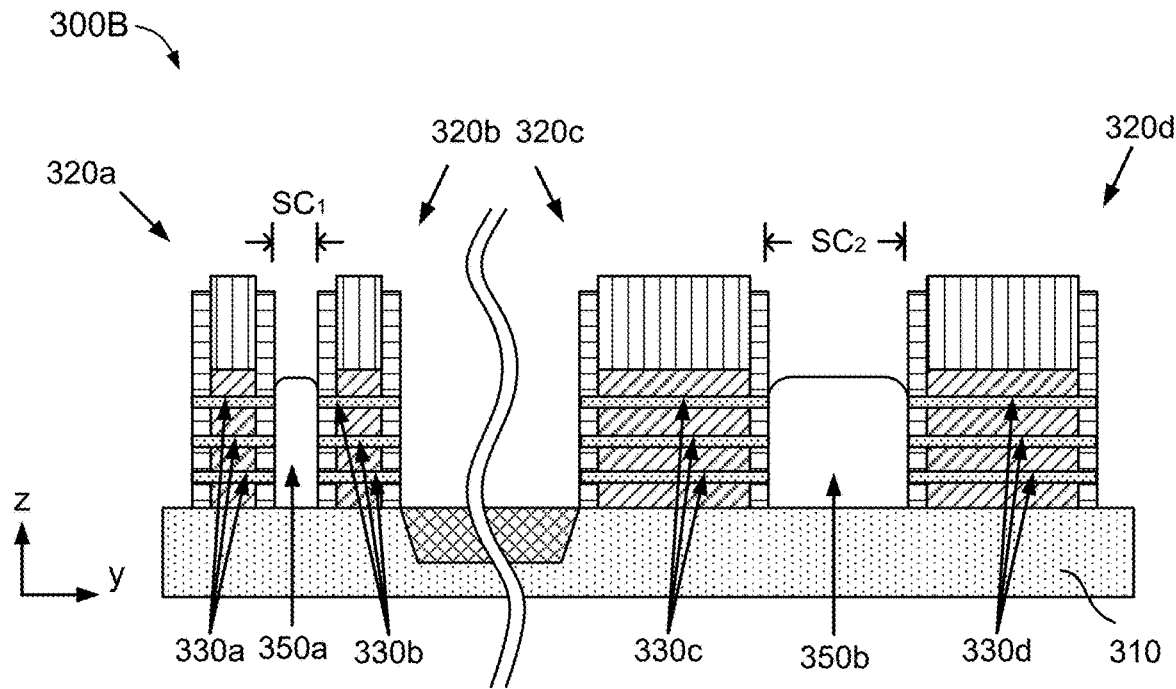

FIGS. 3A and 3B are cross-sectional views of semiconductor structures 300A and 300B directed to a first example and including nanosheet FETs having different channel lengths, according to aspects of the disclosure.

As shown in FIG. 3A, the semiconductor structure 300A includes a substrate 310 and four gate structures 320a, 320b, 320c, and 320d configured to have respective GAA structures. The gate structures 320a, 320b, 320c, and 320d include gate conductors 322a, 322b, 322c, and 322d and hardmask patterns 324a, 324b, 324c, and 324d on the respective gate conductors 322a, 322b, 322c, and 322d. The gate structures 320a, 320b, 320c, and 320d further include gate spacers 326a, 326b, 326c, and 326d on the sidewalls of the gate conductors 322a, 322b, 322c, and 322d and the sidewalls of the hardmask patterns 324a, 324b, 324c, and 324d. The semiconductor structure 300A further includes channel structures 330a, 330b, 330c, and 330d that are made of nanosheets and configured to form channels respectively controllable by the gate structures 320a, 320b, 320c, and 320d. Moreover, the gate structures 320a, 320b, 320c, and 320d also include gate dielectrics (not shown) between the channel structures 330a, 330b, 330c, and 330d and the corresponding gate conductors 322a, 322b, 322c, and 322d.

In some aspects, the gate structures 320a, 320b, 320c, and 320d and the respective channel structures 330a, 330b, 330c, and 330d may be configured as nanosheet FETs similar to the example illustrated with reference to FIG. 2 (i.e., having a GAA structure). As further illustrated below, the present application describes various examples based on nanosheet FETs. However, the manufacturing processes and semiconductor structures described based on nanosheet FETs in this disclosure may also be applicable to FinFETs (i.e., having a FinFET structure).

In some aspects, the gate structures 320a and 320b together with the channel structures 330a and 330b may define the respective channel lengths $CL_a$ and $CL_b$ along a first direction (e.g., the y-direction in FIG. 3A). In some aspects, the gate structures 320c and 320d together with the channel structures 330c and 330d may define the respective channel lengths $CL_c$ and $CL_d$ along a second direction (e.g., the y-direction in FIG. 3A, the same as the first direction in this example but could be different in some examples). In some aspects, at least an isolation structure 340 may be formed in the substrate 310 and disposed between at least the gate structures 320a and 320b and the gate structures 320c and 320d.

As shown in FIG. 3A, a source/drain space between the gate structures 320a and 320b may have a distance $SC_1$ measurable along the first direction. Also, a source/drain space between the gate structures 320c and 320d may have a distance $SC_2$ measurable along the second direction. Additional source/drain structures (e.g., 350a and 350b in FIG. 3B) may be formed in the spaces as the corresponding source or drain terminals.

In some aspects, the semiconductor structure 300A may correspond to a stage where the gate conductors 322a, 322b, 322c, and 322d and the channel structures 330a, 330b, 330c, and 330d are formed, and an epitaxial growing process for forming the source/drain structures (e.g., 350a and 350b in FIG. 3B) has just started. Portions of the source/drain structures 352a and 352b may begin to grow from the exposed portions of the channel structures 330a, 330b, 330c, and 330d horizontally and from the upper surface of the substrate 310 upwardly (e.g., the z direction).

In some aspects, each one of the channel lengths $CL_a$ and $CL_b$ may be configured to have a first channel length, and each one of the channel lengths $CL_c$ and $CL_d$ may be configured to have a second channel length (subject to a manufacturing tolerance due to the process variation) different from the first channel length. In some aspects, the second channel length may be at least 1.5 times the first channel length. Accordingly, a transistor formed based on the gate structures 320a, and 320b may be referred to as a short-channel device, while a transistor formed based on the gate structures 320c, and 320d may be referred to as a long-channel device.

In some aspects, the distance $SC_1$ may range from 0.75 times to 1.25 times the first channel length (e.g., corresponding to the channel lengths $CL_a$ and $CL_b$). In some aspects, the distance $SC_2$ may range from 0.75 times to 1.25 times the second channel length (e.g., corresponding to the channel lengths $CL_c$ and $CL_d$). In some aspects, the first channel length may be equal to or less than 20 nm, and the second channel length may be equal to or greater than 30 nm. In some aspects, the distance $SC_2$ may not be further reduced, because of the design rules or limitations imposed by a lithographic process for defining the sizes and positions of these elements.

As shown in FIG. 3B, the semiconductor structure 300B may correspond to processing the semiconductor structure 300A to a stage where the source/drain structures 350a and 350b are formed. Components in FIG. 3B that are the same or similar as those in FIG. 3A are depicted using the same shapes and shades, and many of the reference numbers thereof are omitted in FIG. 3B for clarity.

As shown in FIG. 3B, the source/drain structure 350a is formed in the source/drain space between the gate structures 320a and 320b and coupling the channel structures 330a and 330b, and the source/drain structure 350b is formed in the source/drain space between the gate structures 320c and 320d and coupling the channel structures 330c and 330d. In this example, the source/drain structure 350a grown from various portions (352a) may be able to merge and fill the source/drain space between the gate structures 320a and 320b during a certain processing time. In some aspects, while the distance $SC_2$ of the source/drain space between the gate structures 320c and 320d is much greater than the distance $SC_1$ of the source/drain space between the gate structures 320a and 320b, the source/drain structure 350b grown from various portions (352b) may still be able to merge and fill the source/drain space between the gate structures 320c and 320d during about the same processing time for forming the source/drain structure 350a. In some aspects, this is because the source/drain structure 350b may be epitaxially grown from the exposed portions of the channel structures 330c and 330d horizontally as well as from the upper surface of the substrate 310 upwardly (e.g., from the portions 352b in FIG. 3A).

Figure 4A:
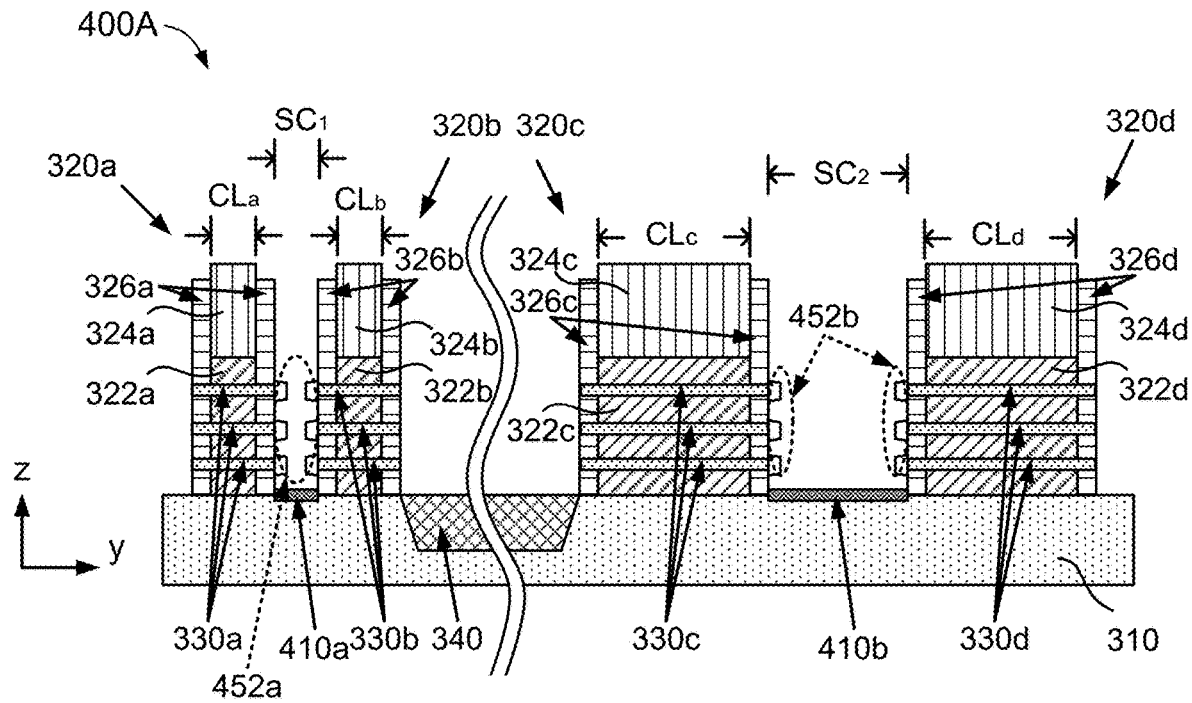
FIGS. 4A and 4B are cross-sectional views of semiconductor structures directed to a second example and including nanosheet FETs having different channel lengths, according to aspects of the disclosure.
Figure 4B:
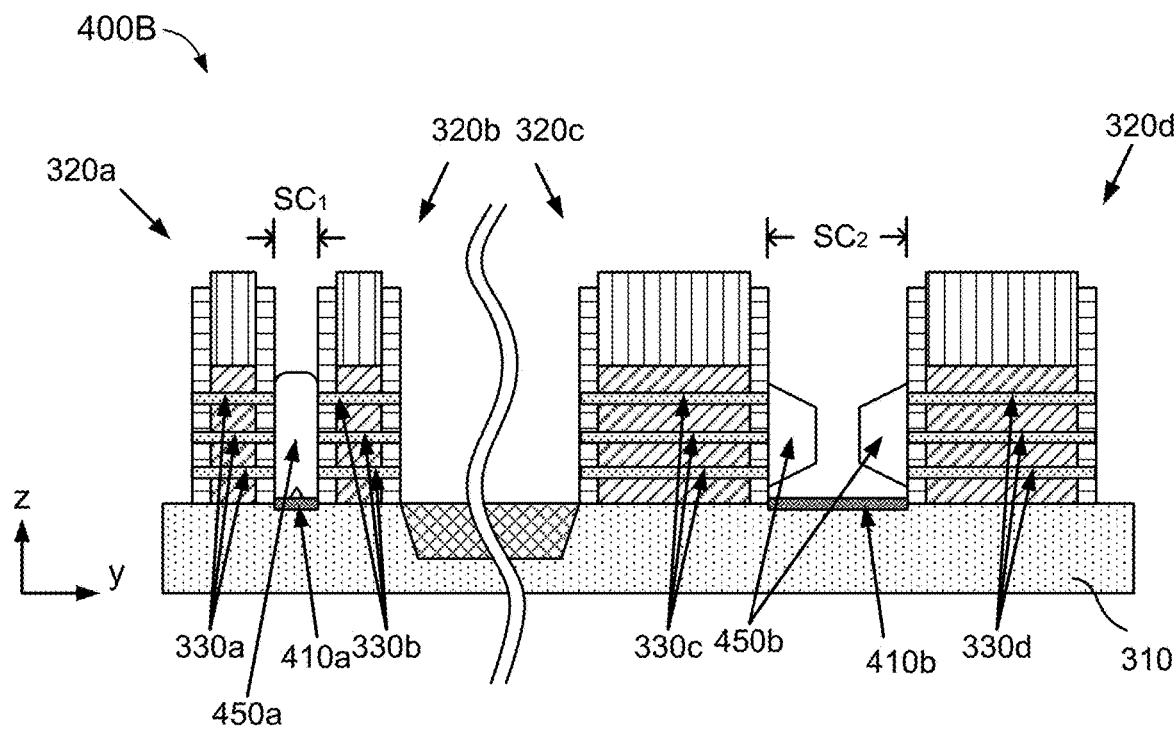

FIGS. 4A and 4B are cross-sectional views of semiconductor structures directed to a second example and including nanosheet FETs having different channel lengths, according to aspects of the disclosure. Components in FIGS. 4A and 4B that are the same or similar as those in FIG. 3A are depicted using the same shapes and shades and given the same reference numbers.

As shown in FIG. 4A, the semiconductor structure 400A includes a substrate 310 and four gate structures 320a, 320b, 320c, and 320d. In this non-limiting example, the channel lengths $CL_a$, $CL_b$, $CL_c$, and $CL_d$, the distance $SC_1$ between the gate structures 320a and 320b, and the distance $SC_2$ between the gate structures 320c and 320d may be the same as those in FIG. 3A.

Moreover, compared with the semiconductor structure 300A, the semiconductor structure 400A further includes a bottom dielectric structure 410a disposed on the substrate 310 in the source/drain space between the gate structures 320a and 320b and a bottom dielectric structure 410b disposed on the substrate 310 in the source/drain space between the gate structures 320c and 320d. In some aspects, the bottom dielectric structures may improve leakage and capacitance for the resulting nanosheet FETs (or FinFETs). In some aspects, the bottom dielectric structures 410a and 410b may include $SiO_2$, SiN, SiOC, SiOCN, or a combination thereof.

In some aspects, the semiconductor structure 400A may correspond to a stage where the gate conductors 322a, 322b, 322c, and 322d and the channel structures 330a, 330b, 330c, and 330d are formed, and an epitaxial growing process for forming the source/drain structures (e.g., 450a and 450b in FIG. 4B) has just started. Portions of the source/drain structures 452a and 452b may begin to grow from the exposed portions of the channel structures 330a, 330b, 330c, and 330d horizontally. However, because of the material of the bottom dielectric structures 410a and 410b, the source/drain structures may not be able to grow, at all or at a sufficient speed, from the bottom dielectric structures 410a and 410b upwardly (e.g., the z direction).

As shown in FIG. 4B, the semiconductor structure 400B may correspond to processing the semiconductor structure 400A to a stage where the source/drain structures 450a and 450b are formed. Components in FIG. 4B that are the same or similar as those in FIG. 4A are depicted using the same shapes and shades, and many of the reference numbers thereof are omitted in FIG. 4B for clarity.

As shown in FIG. 4B, the source/drain structure 450a is formed in the source/drain space between the gate structures 320a and 320b and coupling the channel structures 330a and 330b, and the source/drain structure 450b is formed in the source/drain space between the gate structures 320c and 320d and respectively connected to the channel structures 330c and 330d. In some aspects, as the distance $SC_2$ of the source/drain space between the gate structures 320c and 320d is much greater than the distance $SC_1$ of the source/drain space between the gate structures 320a and 320b, during about the processing time for growing a suitable source/drain structure 450a in the source/drain space between the gate structures 320a and 320b and without the help of epitaxial growing from the bottom of the source/drain space, the source/drain structure 450b may be formed as two parts separately disposed on the sidewalls of the gate structures 320c and 320d and may leave a gap in between.

Therefore, in some aspects compared with the semiconductor structure 300B, additional processing steps on the semiconductor structure 400B may be needed in order to electrically coupled with both channel structures 330c and 330d via the source/drain structure 450b. In one example, a larger conductive structure over the source/drain structure 450b may be needed to electrically connect the different parts of the source/drain structure 450b. In one example, the source/drain structure 450a may need to be covered such that additional epitaxial process (or processing time) for the source/drain structure 450b may be performed to further increase the size of the source/drain structure 450b. In some aspects, these additional steps may increase the complexity of the manufacturing process, increase the cost of manufacturing the semiconductor structure, lower the yield rate of the manufacturing process, and/or lower the throughput of the manufacturing process.

Figure 5A:
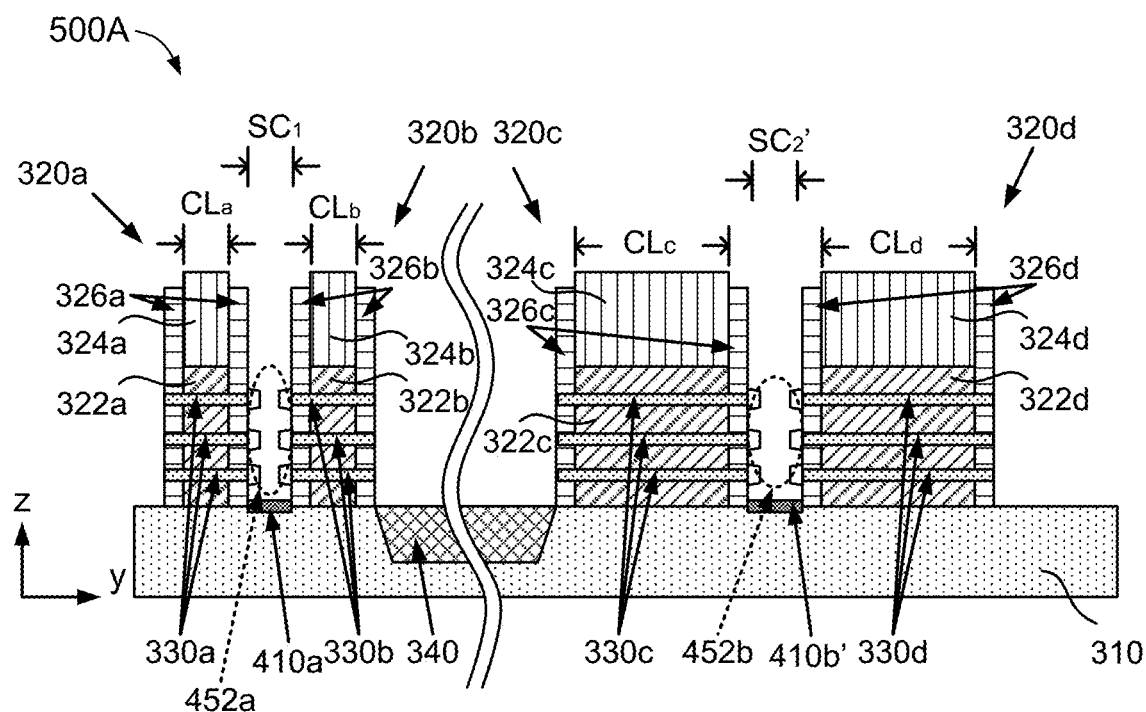
FIGS. 5A and 5B are cross-sectional views of semiconductor structures directed to a third example and including nanosheet FETs having different channel lengths, according to aspects of the disclosure.
Figure 5B:
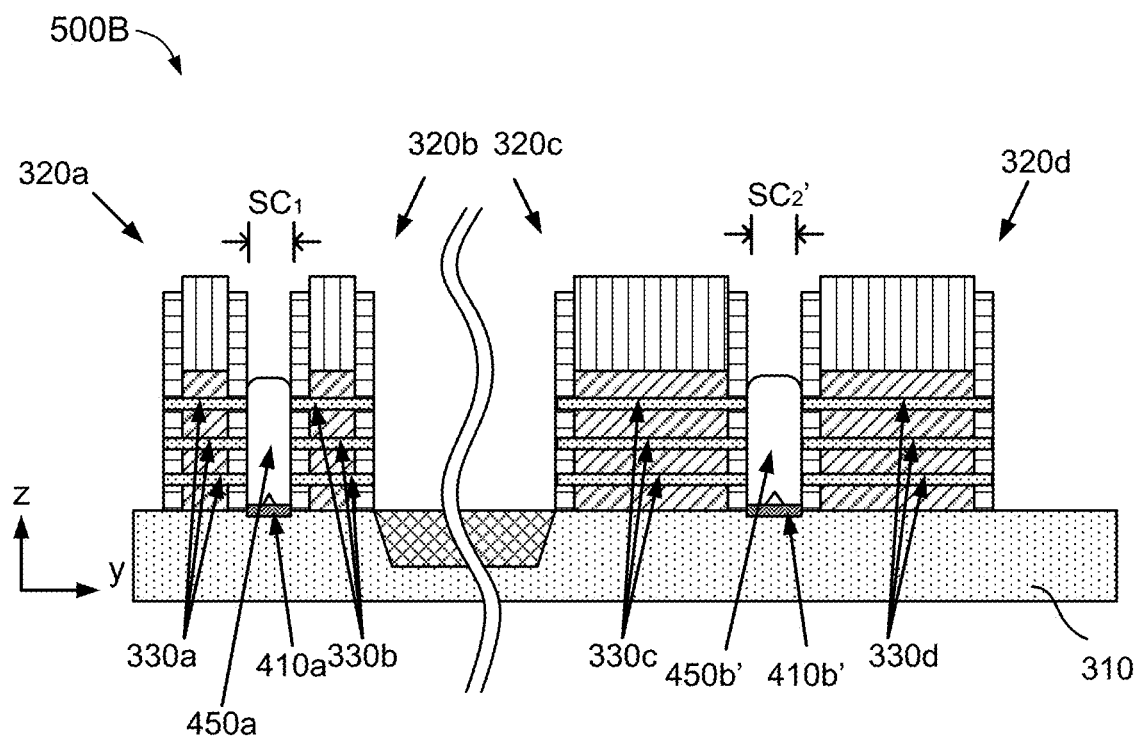

FIGS. 5A and 5B are cross-sectional views of semiconductor structures directed to a third example including nanosheet FETs having different channel lengths, according to aspects of the disclosure. Components in FIGS. 5A and 5B that are the same or similar as those in FIGS. 3A and 4A are depicted using the same shapes and shades and given the same reference numbers.

As shown in FIG. 5A, the semiconductor structure 500A includes a substrate 310 and four gate structures 320a, 320b, 320c, and 320d. The gate structure 320a is disposed on the substrate 310 and has a channel length $CL_a$ measurable along a first direction (e.g., the y-direction); and the gate structure 320b is disposed on the substrate 310 and has a channel length $CL_b$ measurable along the first direction. A source/drain space between the gate structure 320a and the second gate structure 320b has a distance $SC_1$ measurable along the first direction. Also, the gate structure 320c is disposed on the substrate 310 and has a channel length $CL_c$ measurable along a second direction (e.g., the y-direction); and the gate structure 320d is disposed on the substrate 310 and has a channel length $CL_d$ measurable along the second direction. A source/drain space between the gate structure 320c and the second gate structure 320d has a distance $SC_2'$ measurable along the second direction.

In some aspects, a channel structure 330a may be configured to form a channel controllable by the gate structure 320a; a channel structure 330b may be configured to form a channel controllable by the gate structure 320b; a channel structure 330c may be configured to form a channel controllable by the gate structure 320c; and a channel structure 330d may be configured to form a channel controllable by the gate structure 320d. As shown in FIG. 5A, in some aspects, the channel structure 330a may include first nanosheets surrounded by the gate structure 320a; the channel structure 330b may include second nanosheets surrounded by the gate structure 320b; the channel structure 330c may include third nanosheets surrounded by the gate structure 320c; and the channel structure 330d may include fourth nanosheets surrounded by the gate structure 320d. In some other examples not shown in FIG. 5A, the channel structure 330a may be modified to include a first fin under the gate structure 320a; the channel structure 330b may be modified to include a second fin under the gate structure 320b; the channel structure 330c may be modified to include a third fin under the gate structure 320c; and the channel structure 330d may be modified to include a fourth fin under the gate structure 320d.

As shown in FIG. 5A, in this non-limiting example, the channel lengths $CL_a$, $CL_b$, $CL_c$, and $CL_d$, and the distance $SC_1$ between the gate structures 320a and 320b may be the same as those in FIGS. 3A and 4A. However, compared with the semiconductor structure 400A in FIG. 4A, the distance $SC_2'$ between the gate structures 320c and 320d in the semiconductor structure 500A may be arranged to be shorter than the distance $SC_2$ between the gate structures 320c and 320d in the semiconductor structure 400A. In some aspects, the shorter distance $SC_2'$ may be less than the spacing allowable under the design rules of the lithographic process for defining the sizes and positions of the gate structures 320c and 320d, but may be possible based on at least the improved manufacturing process as further illustrated with reference to FIGS. 6A-6G and 7 in this disclosure.

In some aspects, the distance $SC_1$ may range from 0.75 times to 1.25 times the first channel length (e.g., corresponding to the channel lengths $CL_a$ and $CL_b$). In some aspects, the second channel length (e.g., corresponding to the channel lengths $CL_c$ and $CL_d$) may be at least 1.5 times the first channel length (e.g., corresponding to the channel lengths $CL_a$ and $CL_b$). In some aspects, the first channel length may be equal to or less than 20 nm, and the second channel length may be equal to or greater than 30 nm. Furthermore, in some aspects, the distance $SC_1$ may range from 0.75 times to 1.25 times the distance $SC_2'$. In some aspects, a difference between the distance $SC_1$ and the distance $SC_2'$ may be less than 5 nm.

Moreover, the semiconductor structure 500A further includes a bottom dielectric structure 410a disposed on the substrate 310 in the source/drain space between the gate structures 320a and 320b and a bottom dielectric structure 410b' disposed on the substrate 310 in the source/drain space between the gate structures 320c and 320d. In some aspects, the bottom dielectric structure 410b' may correspond to the bottom dielectric structure 410b in FIG. 4A, but with a reduced size as the distance $SC_2'$ between the gate structures 320c and 320d is smaller than the distance $SC_2$. As discussed above, in some aspects, the bottom dielectric structures may improve leakage and capacitance for resulting nanosheet FETs (or FinFETs). In some aspects, the bottom dielectric structures 410a and 410b' may include $SiO_2$, SiN, SiOC, SiOCN, or a combination thereof.

In some aspects, the semiconductor structure 500A may correspond to a stage where the gate conductors 322a, 322b, 322c, and 322d and the channel structures 330a, 330b, 330c, and 330d are formed, and an epitaxial growing process for forming the source/drain structures (e.g., 450a and 450b' in FIG. 5B) has just started. Portions of the source/drain structures 452a and 452b may begin to grow from the exposed portions of the channel structures 330a, 330b, 330c, and 330d horizontally. Because of the material of the bottom dielectric structures 410a and 410b', the source/drain structures may not be able to grow, at all or at a sufficient speed, from the bottom dielectric structures 410a and 410b' upwardly (e.g., the z direction).

As shown in FIG. 5B, the semiconductor structure 500B may correspond to processing the semiconductor structure 500A to a stage where the source/drain structures 450a and 450b' are formed. Components in FIG. 5B that are the same or similar as those in FIG. 5A are depicted using the same shapes and shades, and many of the reference numbers thereof are omitted in FIG. 5B for clarity.

In some aspects, the source/drain structure 450a may be disposed between the gate structure 320a and the gate structure 320b, and the source/drain structure 450a may couple the channel structure 330a and the channel structure 330b. In some aspects, the source/drain structure 450b' may be disposed between the gate structure 320c and the gate structure 320d, and the source/drain structure 450b' may couple the channel structure 330c and the channel structure 330d. In some aspects, the source/drain structure 450a and the source/drain structure 450b' are epitaxially grown structures. In some aspects, the bottom dielectric structure 410a may be disposed between the source/drain structure 450a and the substrate 310. In some aspects, the bottom dielectric structure 410b' may be disposed between the source/drain structure 450b' and the substrate 310.

In some aspects, the source/drain structure 450b' may correspond to the source/drain structure 450b in FIG. 4B, but with a reduced size as the distance $SC_2'$ between the gate structures 320c and 320d is smaller than the distance $SC_2$.

In some aspects, as the distance $SC_2'$ of the source/drain space between the gate structures 320c and 320d may be arranged to be comparable with the distance $SC_1$ of the source/drain space between the gate structures 320a and 320b, during about the processing time for growing a suitable source/drain structure 450a in the source/drain space between the gate structures 320a and 320b, the source/drain structure 450b' may also be able to merge and sufficiently connecting the channel structures 330c and 330d.

Therefore, in some aspects compared with the semiconductor structure 400B, additional processing steps on the semiconductor structure 500B to address the gap of the different parts of the source/drain structure 450b may not be needed. Accordingly, the omission of these additional steps may reduce the complexity of the manufacturing process, reduce the cost of manufacturing the semiconductor structure, increase the yield rate of the manufacturing process, and/or increase the throughput of the manufacturing process. Also, the reduced size of the distance $SC_2'$ of the source/drain space between the gate structures 320c and 320d may also help to reduce the overall size of the resulting IC and improve the performance of the resulting transistors and/or the IC.

FIGS. 6A-6G illustrate an example partial method for manufacturing a semiconductor structure (such as the semiconductor structure 500B in FIG. 5B), according to aspects of the disclosure.

Figure 6A:
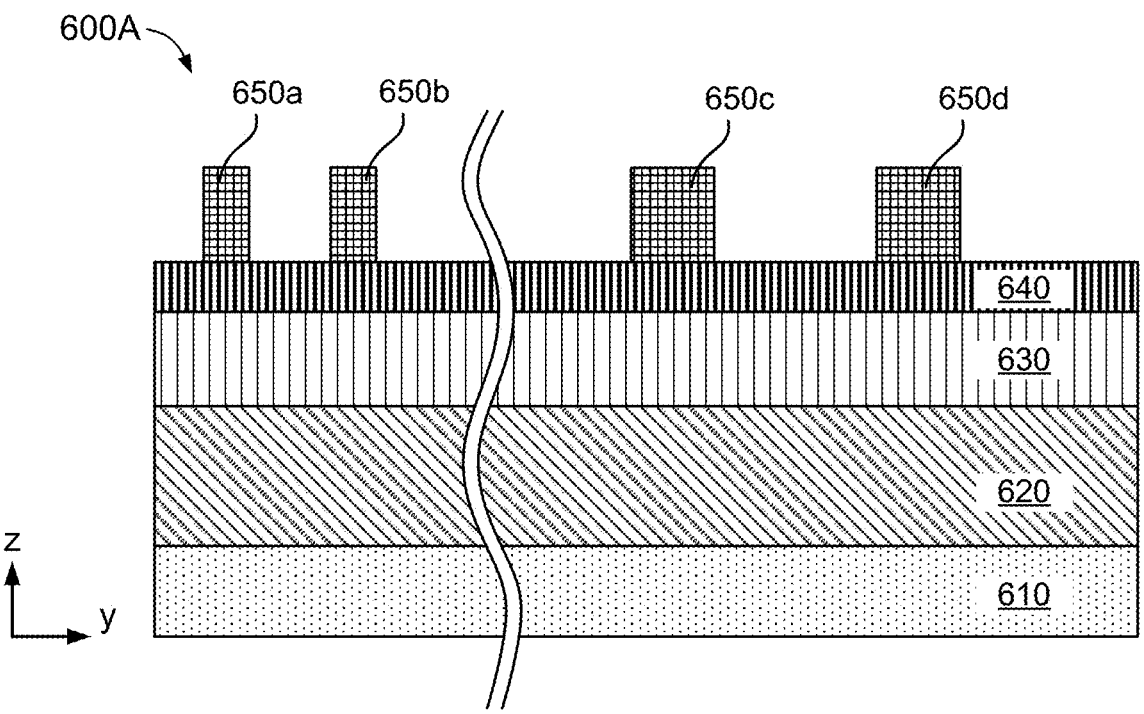
FIGS. 6A-6G illustrate an example partial method for manufacturing a semiconductor structure, according to aspects of the disclosure.

As shown in FIG. 6A, a semiconductor structure 600A is formed. The semiconductor structure 600A includes an intermediate having a substrate 610, a stack 620 of one or more gate/channel material layers on the substrate 610, and one or more hardmask layers such as a first hardmask layer 630 and a second hardmask layer 640. The structure 600A further includes a plurality of mask patterns 650a, 650b, 650c, and 650d formed on the intermediate structure.

In some aspects, the substrate 610 includes Si, Ge, As, or any combination thereof. In some aspects, the stack 620 may include one or more layers of sacrificial gate material layers (e.g., polysilicon). In some aspects, the stack 620 may include layers of nanosheet layers and sacrificial gate material layers stacked in an alternating manner. In some aspects, the hardmask layer 630 may include SiN. In some aspects, the hardmask layer 640 may include amorphous silicon, $SiO_2$, amorphous carbon, or a combination thereof.

In some aspects, the mask patterns 650a, 650b, 650c, and 650d may include a photoresist material, and the mask patterns 650a, 650b, 650c, and 650d may be formed based on performing a logographic process on a photoresist layer.

Figure 6B:
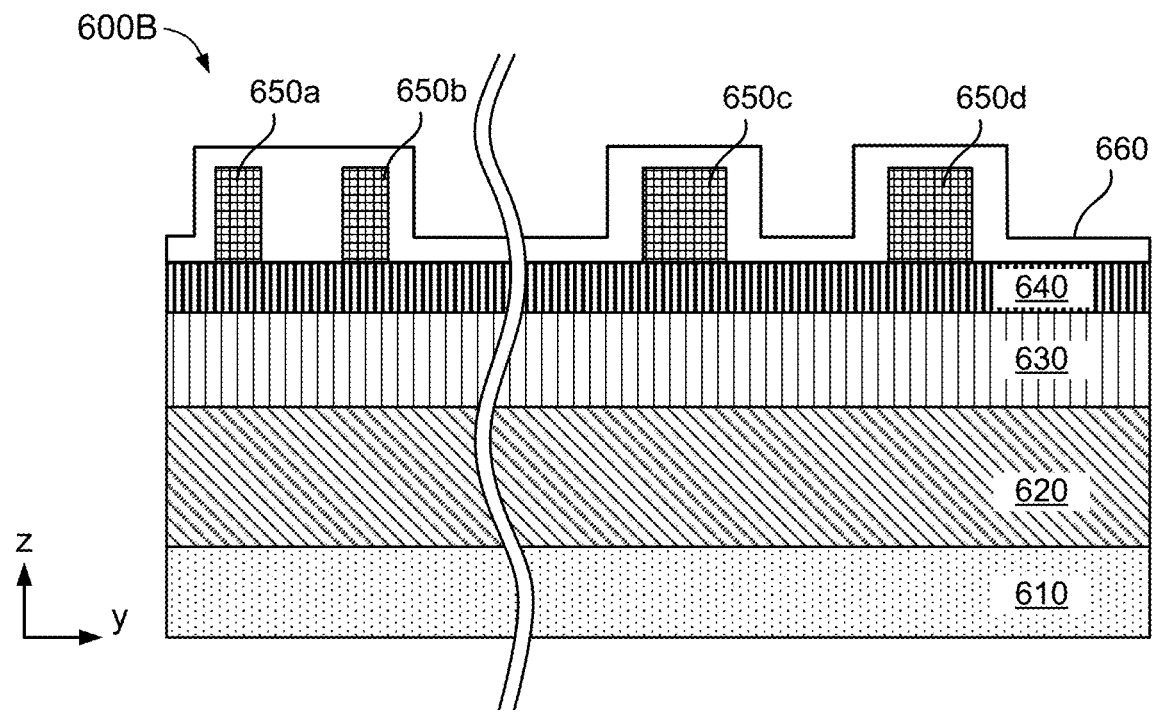

As shown in FIG. 6B, a semiconductor structure 600B is formed based on the semiconductor structure 600A, by forming a layer of capping film material on the mask patterns 650a, 650b, 650c, and 650d. In some aspects, the layer of capping film material may include $SiO_2$.

Figure 6C:
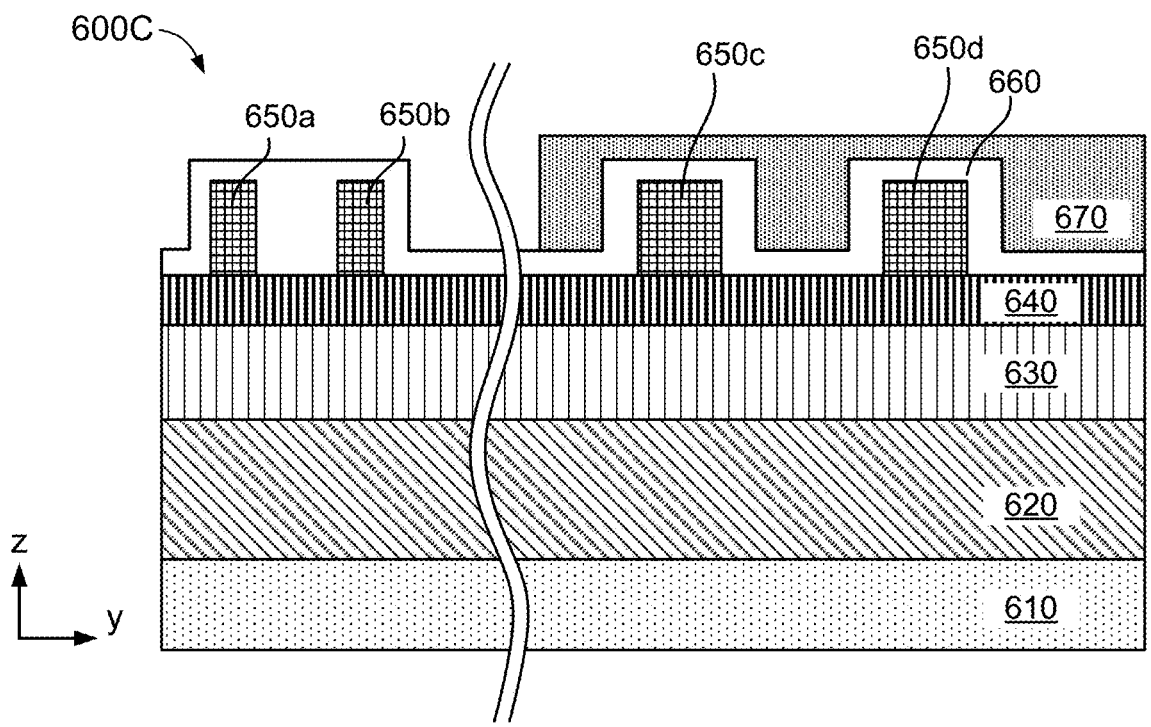

As shown in FIG. 6C, a semiconductor structure 600C is formed based on the semiconductor structure 600C, by forming a block pattern 670 over the mask patterns 650c and 650d without covering the mask patterns 650a and 650b. In some aspects, the block pattern 670 may include a photoresist material and may be formed based on another lithographic process.

Figure 6D:
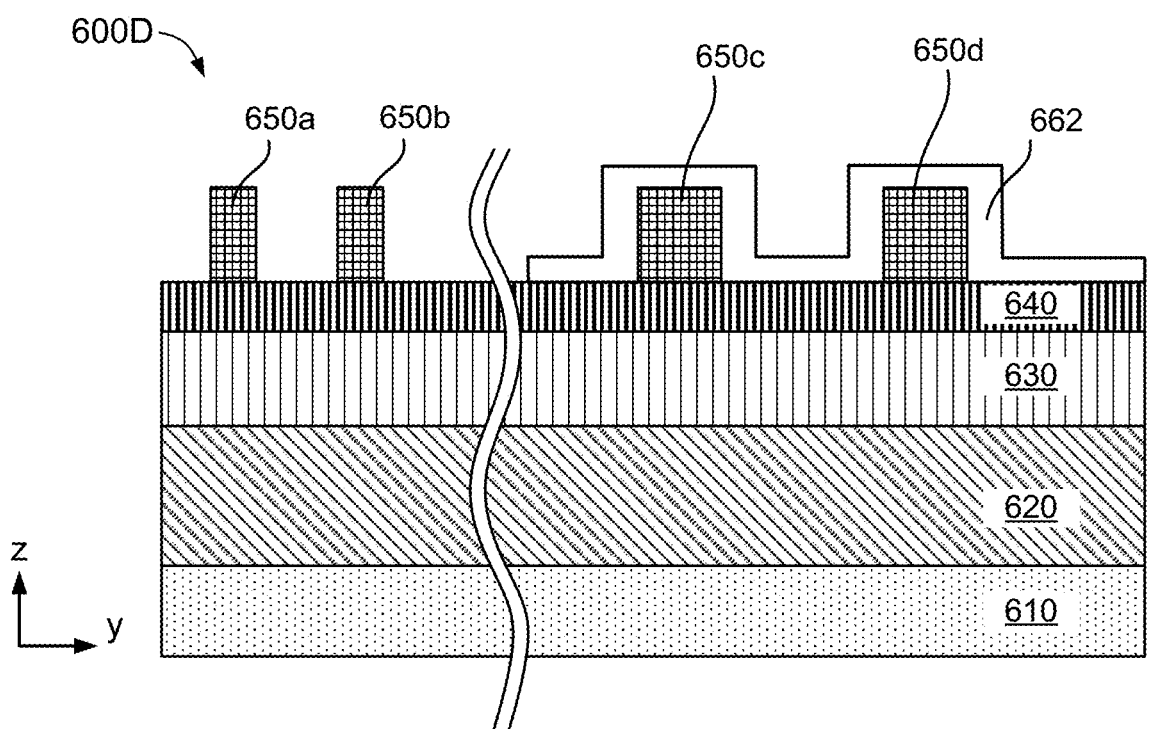

As shown in FIG. 6D, a semiconductor structure 600D is formed based on the semiconductor structure 600D, by performing a wet etching process using the block pattern 670 as a mask to remove a portion of the layer of capping film material 660 that covers the mask patterns 650a and 650b. A remaining portion of the layer of capping film material 660 may become a capping film 662 covering the mask patterns 650c and 650d. In some aspects, the capping film 662 may constitute spacers (e.g., spacers 664c and 664d in FIG. 6E) on sidewalls of the mask patterns 650c and 650d. In some aspects, the block pattern 670 may be removed by another wet etching process after forming the capping film 662.

Figure 6E:
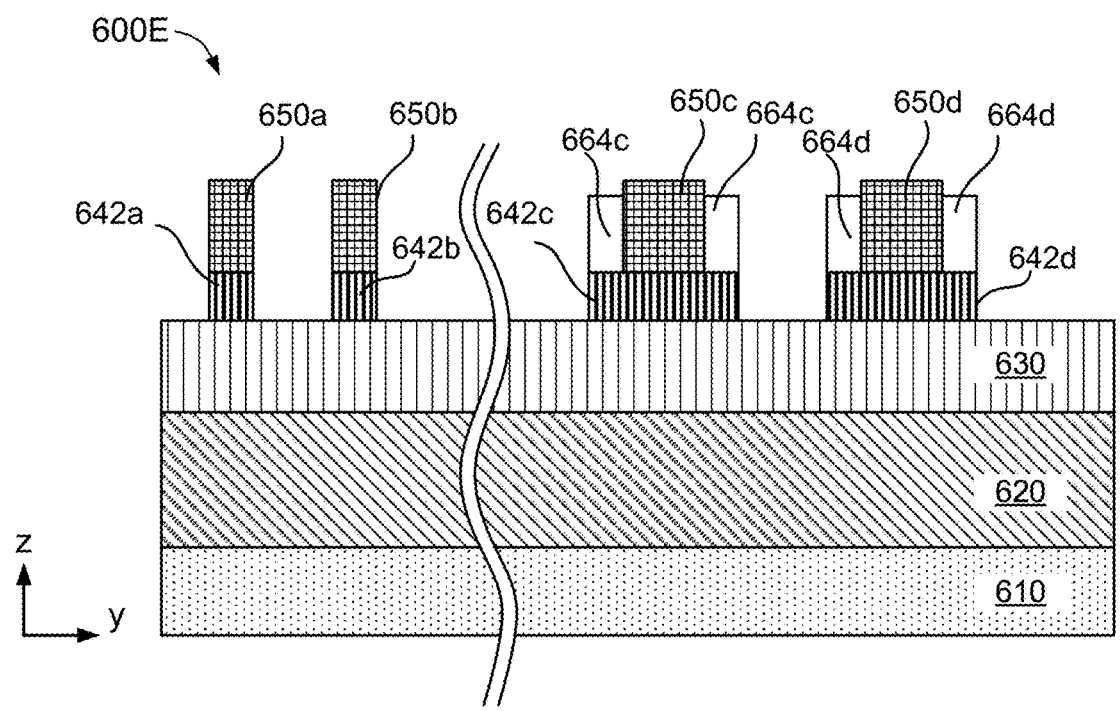

As shown in FIG. 6E, a semiconductor structure 600E is formed based on the semiconductor structure 600D, by patterning the hardmask layer 640 to become a first hardmask pattern 642a based on the mask pattern 650a, a second hardmask pattern 642b based on the mask pattern 650b, a third hardmask pattern 642c based on the mask pattern 650c and the corresponding spacers 664c on the sidewalls of the mask pattern 650c, and a fourth hardmask pattern 642d based on the mask pattern 650d and the corresponding spacers 664d on the sidewalls of the mask pattern 650d. In some aspects, the hardmask layer 640 may be patterned based on performing a dry etching process using the mask patterns 650a, 650b, 650c, and 650d and the spacers 664c and 664d as masks. In some aspects, during the dry etching process, a horizontal portion of the capping film 662 may be removed, while a vertical portion of the capping film 662 may only be partially removed to become the spacers 664d, as the vertical portion has a greater thickness along the vertical direction to withstand the dry etching process.

Figure 6F:
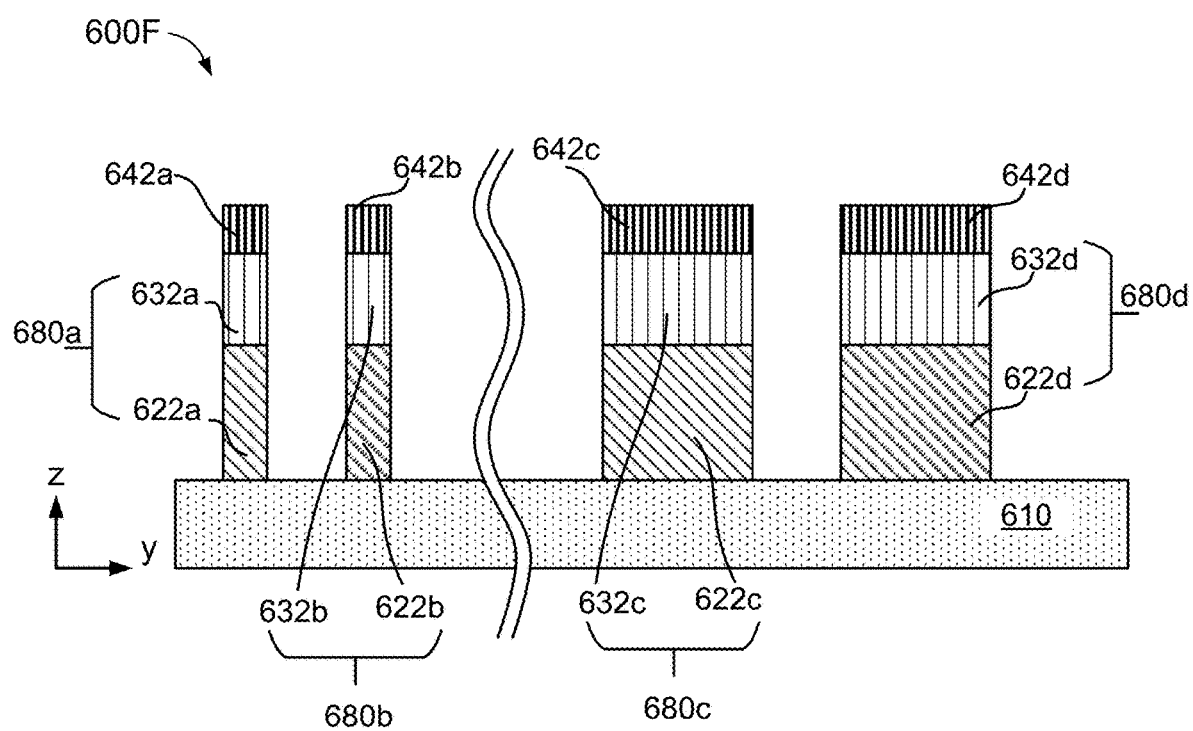

As shown in FIG. 6F, a semiconductor structure 600F is formed based on the semiconductor structure 600E, by patterning the hardmask layer 630 and the stack 620 to become a first slab 680a based on the first hardmask pattern 642a, a second slab 680b based on the second hardmask pattern 642b, a third slab 680c based on the third hardmask pattern 642c, and a fourth slab 680d based on the fourth hardmask pattern 642d.

In some aspects, the hardmask layer 630 and the stack 620 may be patterned by a single dry etching process or two dry etching processes using the hardmask patterns 642a, 642b, 642c, and 642d as masks. In some aspects, each one of the slabs 680a, 680b, 680c, and 680d includes a corresponding upper portion 632a, 632b, 632c, and 632d from patterning the hardmask layer 630 and a corresponding lower portion 622a, 622b, 622c, and 622d from patterning the stack 620.

Figure 6G:
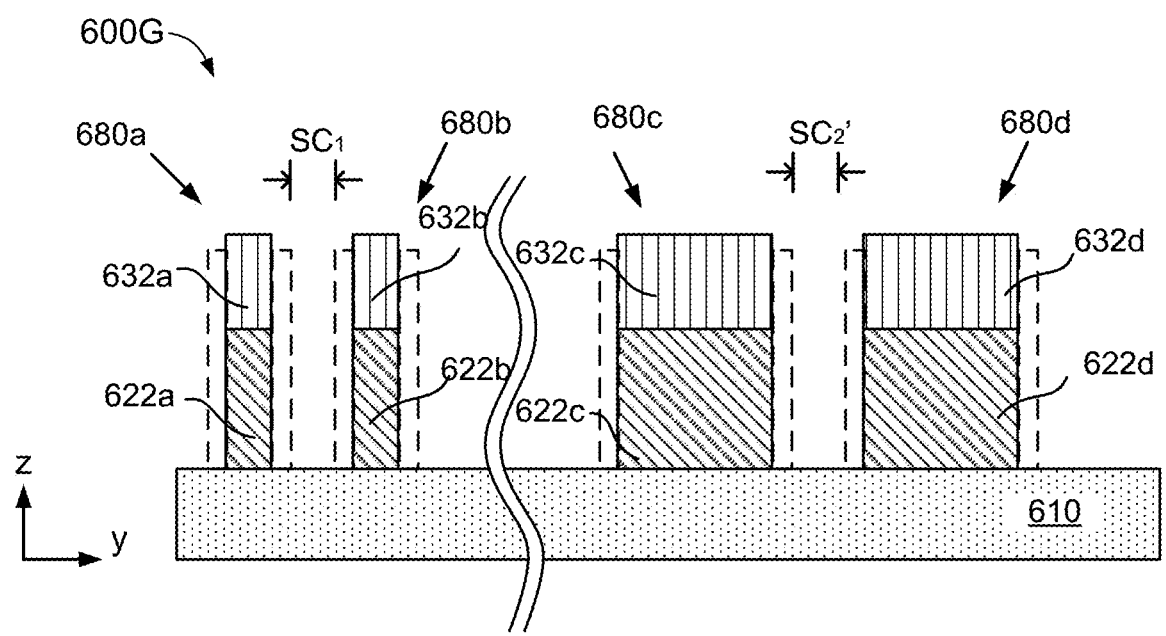

As shown in FIG. 6G, a semiconductor structure 600G is formed based on the semiconductor structure 600F, by removing the hardmask patterns 642a, 642b, 642c, and 642d. In some aspects, the hardmask patterns 642a, 642b, 642c, and 642d may be removed by performing a chemical-mechanical polishing (CMP) process.

In some aspects, based on the semiconductor structure 600G, the semiconductor structure 500B as shown in FIG. 5B may be formed by forming the gate structures 320a, 320b, 320c, and 320d based on the slabs 680a, 680b, 680c, and 680d, respectively. In some aspects, the substrate 610 may correspond to the substrate 310 in FIGS. 5A and 5B, and the upper portion 632a, 632b, 632c, and 632d may correspond to the hardmask patterns 324a, 324b, 324c, and 324d in FIGS. 5A and 5B.

In some aspects, the lower portions 622a, 622b, 622c, and 622d of the slabs 680a, 680b, 680c, and 680d may be processed to form the gate conductors 322a, 322b, 322c, and 322d, the gate dielectrics, and the channel structures 330a, 330b, 330c, and 330d. In some aspects, the gate spacers 326a, 326b, 326c, and 326d may be formed on the sidewalls of the gate conductors 322a, 322b, 322c, and 322d and the sidewalls of the hardmask patterns 324a, 324b, 324c, and 324d. In some aspects, the channel structures 330a, 330b, 330c, and 330d may include nanosheets surrounded by the corresponding gate structures 320a, 320b, 320c, and 320d as shown in FIGS. 5A and 5B (i.e., having a GAA structure). In some aspects, the channel structures 330a, 330b, 330c, and 330d may include fins under the corresponding gate structures 320a, 320b, 320c, and 320d as an alternative implementation (i.e., having a FinFET structure).

In some aspects, a source/drain structure 450a may be formed between the gate structures 330a and 330b, where the source/drain structure 450a may couple the channel structures 330a and 330b. In some aspects, a source/drain structure 450b' may be formed between the gate structures 330c and 330d, where the source/drain structure 450b' may couple the channel structures 330c and 330d. In some aspects, the source/drain structures 450a and 450b' may be formed by an epitaxially growing process. In some aspects, a bottom dielectric structure 410a may be formed prior to the forming the source/drain structure 450a, where the bottom dielectric structure 410a may be between the source/drain structure 450a and the substrate 310/610. In some aspects, a bottom dielectric structure 410b' may be formed prior to the forming the source/drain structure 450b', where the bottom dielectric structure 410b' may be between the source/drain structure 450b' and the substrate 310/610.

As shown in FIG. 6G, the dotted lines may represent the positions of the gate spacers 326a, 326b, 326c, and 326d after they are formed. As shown in FIG. 6G, the distance $SC_1$ between the gate structures 320a and 320b in FIG. 5B may correspond to the distance between the positions of the gate spacers associated with the of the slabs 680*a* and 680*b*, and the distance $SC_2'$ between the gate structures 320*c* and 320*d* in FIG. 5B may correspond to the distance between positions of the gate spacers associated with the of the slabs 680*c* and 680*d*. In some aspects, the distance $SC_1$ may range from 0.75 times to 1.25 times the distance $SC_2'$. In some aspects, a difference between the distance $SC_1$ and the distance $SC_2'$ may be less than 5 nm.

Figure 7:
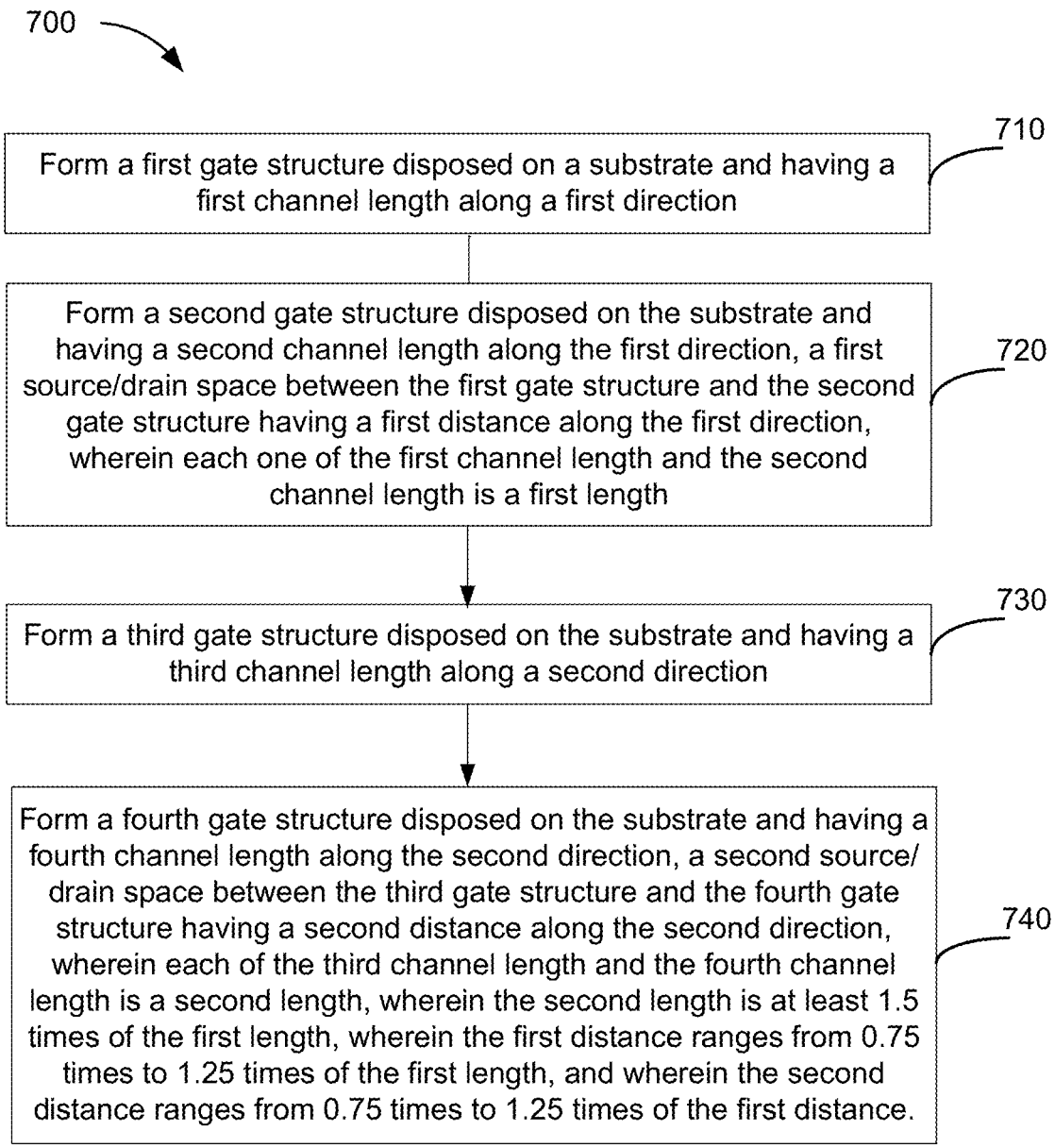
FIG. 7 illustrates a method for manufacturing a semiconductor structure, according to aspects of the disclosure.

FIG. 7 illustrates a method 700 for manufacturing a semiconductor structure (such as the semiconductor structure 500B in FIG. 5B), according to aspects of the disclosure.

At operation 710, a first gate structure (e.g., the gate structure 320*a*) disposed on a substrate (e.g., the substrate 310) and having a first channel length (e.g., $CL_a$) along a first direction (e.g., the y-direction) is formed.

At operation 720, a second gate structure (e.g., the gate structure 320*b*) disposed on the substrate (e.g., the substrate 310) and having the first channel length (e.g., $CL_b$ having a channel length same as $CL_a$ in this example) along the first direction (e.g., the y-direction) is formed. A first source/drain space between the first gate structure and the second gate structure has a first distance (e.g., $SC_1$) along the first direction.

At operation 730, a third gate structure (e.g., the gate structure 320*c*) disposed on the substrate (e.g., the substrate 310) and having a second channel length (e.g., $CL_c$) along a second direction (e.g., the y-direction same as the first direction in this example) is formed.

At operation 740, a fourth gate structure (e.g., the gate structure 320*d*) disposed on the substrate (e.g., the substrate 310) and having the second channel length (e.g., $CL_d$ having a channel length same as $CL_c$ in this example) along the second direction (e.g., the y-direction) is formed. A second source/drain space between the third gate structure and the fourth gate structure has a second distance (e.g., $SC_2'$) along the second direction. In some aspects, the second channel length is at least 1.5 times the first channel length. In some aspects, the first distance ranges from 0.75 times to 1.25 times the first channel length. In some aspects, the second distance ranges from 0.75 times to 1.25 times the first distance.

In some aspects, the first channel length may be equal to or less than 20 nm, and the second channel length may be equal to or greater than 30 nm. In some aspects, a difference between the first distance and the second distance may be less than 5 nm.

In some aspects, the method 700 may incorporate the operations and steps as illustrated with reference to FIGS. 6A-6G. In some aspects, the method 700 may include forming a plurality of mask patterns on an intermediate structure, where the plurality of mask patterns includes a first mask pattern, a second mask pattern, a third mask pattern, and a fourth mask pattern. In some aspects, the intermediate structure may include a stack of one or more gate/channel material layers on the substrate, and one or more hardmask layers on the stack. In some aspects, the method 700 may include forming a capping film covering the third mask pattern and the fourth mask pattern without covering the first mask pattern and the second mask pattern, the capping film constituting spacers on sidewalls of the third mask pattern and the fourth mask pattern. In some aspects, the method 700 may include patterning the one or more hardmask layers and the stack to become: a first slab on the substrate based on the first mask pattern, a second slab on the substrate based on the second mask pattern, a third slab on the substrate based on the third mask pattern and the corresponding spacers on the sidewalls of the third mask pattern, and a fourth slab on the substrate based on the fourth mask pattern and the corresponding spacers on the sidewalls of the fourth mask pattern. In some aspects, the first gate structure, the second gate structure, the third gate structure, and the fourth gate structure may be formed based on the first slab, the second slab, the third slab, and the fourth slab, respectively.

In some aspects, the forming the capping film may include forming a layer of capping film material on the plurality of mask patterns; and removing a portion of the layer of capping film material that covers the first mask pattern and the second mask pattern, such that a remaining portion of the layer of capping film material may become the capping film covering the third mask pattern and the fourth mask pattern. In some aspects, the layer of capping film material may include $SiO_2$.

In some aspects, the one or more hardmask layers may include a first hardmask layer over a second hardmask layer. In some aspects, the patterning the one or more hardmask layers and the stack may include patterning a first hardmask layer to become a first hardmask pattern based on the first mask pattern, a second hardmask pattern based on the second mask pattern, a third hardmask pattern based on the third mask pattern and the corresponding spacers on the sidewalls of the third mask pattern, and a fourth hardmask pattern based on the fourth mask pattern and the corresponding spacers on the sidewalls of the fourth mask pattern. In some aspects, the first hardmask layer may include amorphous silicon, SiO2, amorphous carbon, or a combination thereof, and the second hardmask layer may include SiN.

As will be appreciated, a technical advantage of the method 700 is to expand the hardmask patterns for long-channel devices by adding a capping film, such that the spacing between two gate structures of one or more long-channel devices may be reduced. Accordingly, the source/drain structures for the short-channel devices and the long-channel devices may be formed at about the same rate during a same epitaxial growing process. As such, the complexity of the manufacturing process may be reduced, the cost of manufacturing the semiconductor structure may be reduced, the yield rate of the manufacturing process may be increased, and/or the throughput of the manufacturing process may be increased. Also, the reduced spacing between two gate structures also helps to reduce the overall size of the resulting IC and improve the performance of the resulting transistors and/or the IC.

Figure 8:
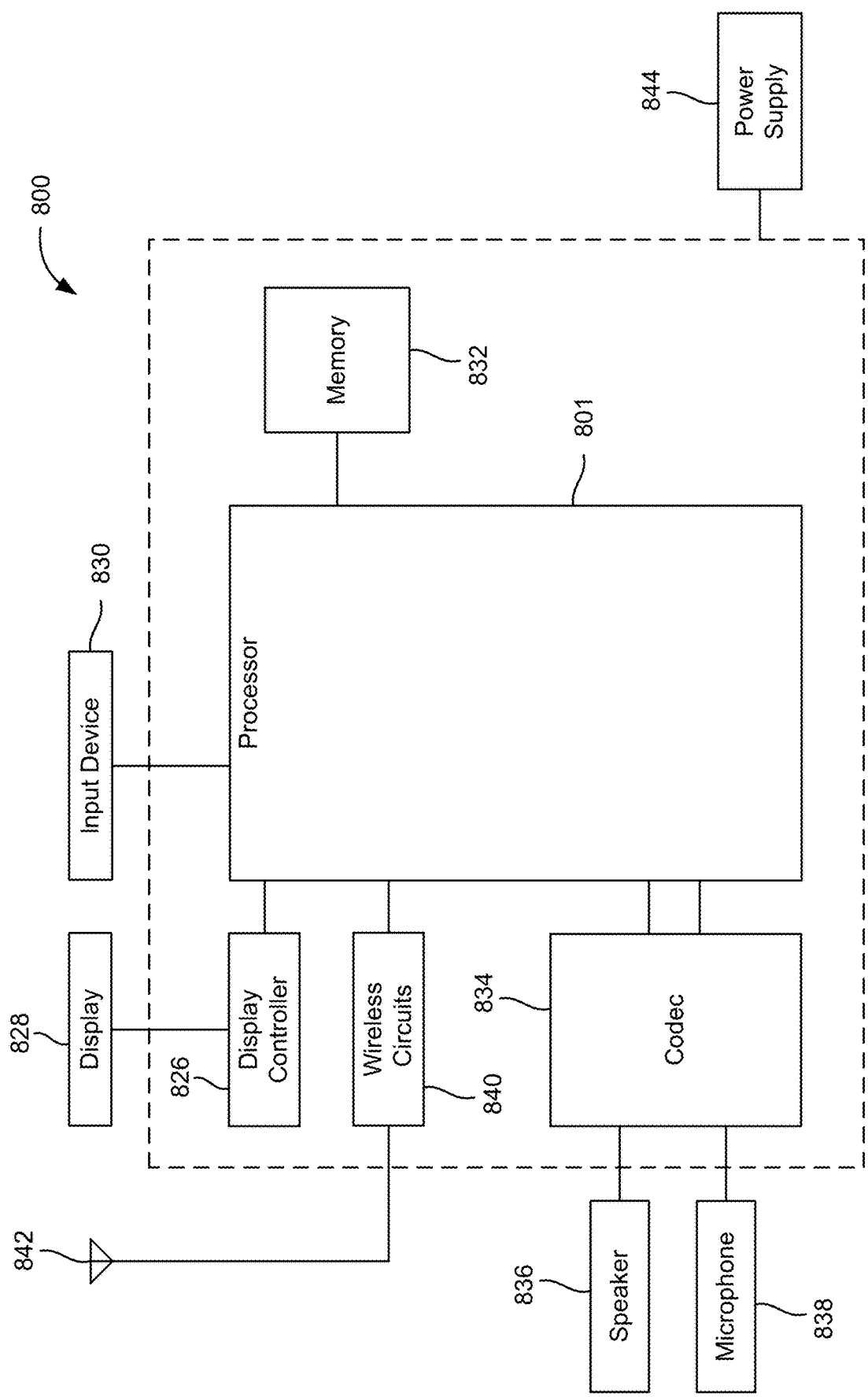
FIG. 8 illustrates a mobile device example, according to aspects of the disclosure.

FIG. 8 illustrates a mobile device 800, according to aspects of the disclosure. In some aspects, the mobile device 800 may be implemented by including one or more ICs including semiconductor structures manufactured based on the examples described in this disclosure.

In some aspects, mobile device 800 may be configured as a wireless communication device. As shown, mobile device 800 includes processor 801. Processor 801 may be communicatively coupled to memory 832 over a link, which may be a die-to-die or chip-to-chip link. Mobile device 800 also includes display 828 and display controller 826, with display controller 826 coupled to processor 801 and to display 828. The mobile device 800 may include input device 830 (e.g., physical, or virtual keyboard), power supply 844 (e.g., battery), speaker 836, microphone 838, and wireless antenna 842. In some aspects, the power supply 844 may directly or indirectly provide the supply voltage for operating some or all of the components of the mobile device 800.

In some aspects, FIG. 8 may include coder/decoder (CODEC) 834 (e.g., an audio and/or voice CODEC) coupled to processor 801; speaker 836 and microphone 838 coupled to CODEC 834; and wireless circuits 840 (which may include a modem, RF circuitry, filters, etc.) coupled to wireless antenna 842 and to processor 801.

In some aspects, one or more of processor 801, display controller 826, memory 832, CODEC 834, and wireless circuits 840 may include one or more ICs including semiconductor structures manufactured according to the examples described in this disclosure.

It should be noted that although FIG. 8 depicts a mobile device 800, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 9:
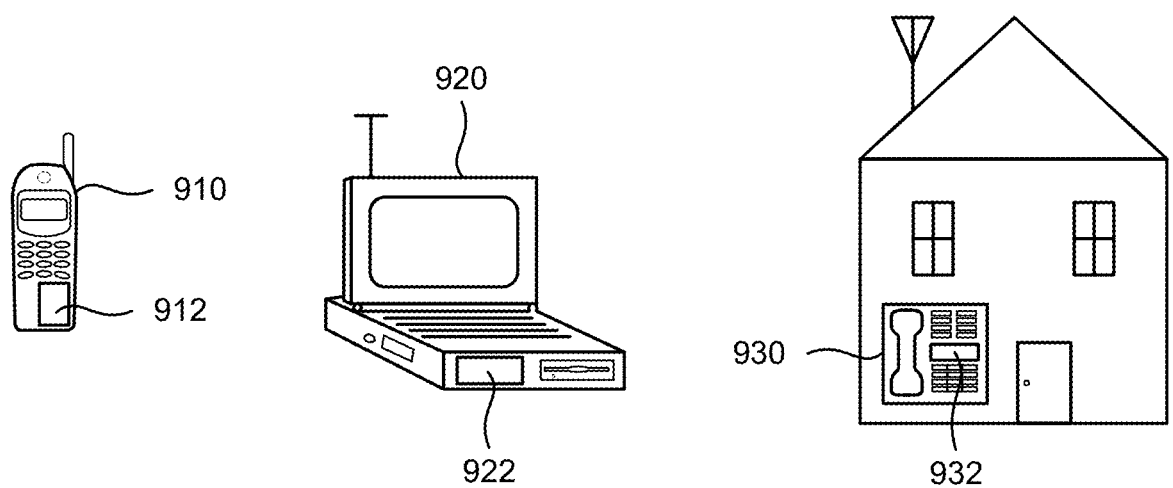
FIG. 9 illustrates various electronic devices that may be integrated with ICs, according to aspects of the disclosure.

FIG. 9 illustrates various electronic devices 910, 920, and 930 that may be integrated with ICs 912, 922, and 932, according to aspects of the disclosure. For example, a mobile phone device 910, a laptop computer device 920, and a fixed location terminal device 930 may each be considered generally user equipment (UE) and may include one or more ICs, such as ICs 912, 922, and 932, and a power supply to provide the supply voltages to power the ICs. The ICs 912, 922, and 932 may be, for example, correspond to an IC including semiconductor structures manufactured based on the examples described above with reference to FIGS. 5A, 5B, and 6A-6G.

The devices 910, 920, and 930 illustrated in FIG. 9 are merely non-limiting examples. Other electronic devices may also feature the ICs including semiconductor structures as described in this disclosure, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device, a laptop computer, an access point, a base station, or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-9 may be rearranged and/or combined into a single component, process, feature, or function or incorporated in several components, processes, or functions. Additional elements, components, processes, and/or functions may also be added without departing from the disclosure. In some implementations, FIGS. 1-9 and the corresponding description may be used to manufacture, create, provide, and/or produce integrated devices. In some implementations, a device may include a die, an integrated device, a die package, an IC, a device package, an IC package, a wafer, a semiconductor device, a system in package (SiP), a system on chip (SoC), a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. Ues can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory) aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A semiconductor structure, comprising: a first gate structure disposed on a substrate and having a first channel length along a first direction; a second gate structure disposed on the substrate and having the first channel length along the first direction, a first source/drain space between the first gate structure and the second gate structure having a first distance along the first direction; a third gate structure disposed on the substrate and having a second channel length along the first direction; and a fourth gate structure disposed on the substrate and having the second channel length along the first direction, a second source/drain space between the third gate structure and the fourth gate structure having a second distance along the first direction, wherein the second channel length is different from the first channel length, and the second distance ranges from 0.75 times to 1.25 times the first distance.

Clause 2. The semiconductor structure of clause 1, wherein: the first channel length is equal to or less than 20 nanometers (nm), and the second channel length is equal to or greater than 30 nm.

Clause 3. The semiconductor structure of any of clauses 1 to 2, wherein: a difference between the first distance and the second distance is less than 5 nanometers (nm).

Clause 4. The semiconductor structure of any of clauses 1 to 3, further comprising: a first channel structure; a second channel structure; a first source/drain structure disposed between the first gate structure and the second gate structure, the first source/drain structure coupling to the first channel structure and the second channel structure; a third channel structure; a fourth channel structure; and a second source/drain structure disposed between the third gate structure and the fourth gate structure, the second source/drain structure coupling to the third channel structure and the fourth channel structure.

Clause 5. The semiconductor structure of any of clauses 1 to 4, wherein the semiconductor structure comprises a gate-all-around structure.

Clause 6. The semiconductor structure of any of clauses 1 to 4, wherein the semiconductor structure comprises a FinFET structure.

Clause 7. The semiconductor structure of clause 4, further comprising: a first bottom dielectric structure between the first source/drain structure and the substrate, and a second bottom dielectric structure between the second source/drain structure and the substrate.

Clause 8. A method of manufacturing a semiconductor structure, comprising: forming a first gate structure disposed on a substrate and having a first channel length along a first direction; forming a second gate structure disposed on the substrate and having the first channel length along the first direction, a first source/drain space between the first gate structure and the second gate structure having a first distance along the first direction; forming a third gate structure disposed on the substrate and having a second channel length along the first direction; and forming a fourth gate structure disposed on the substrate and having the second channel length along the first direction, a second source/drain space between the third gate structure and the fourth gate structure having a second distance along the first direction, wherein the second channel length is different from the first channel length, and the second distance ranges from 0.75 times to 1.25 times the first distance.

Clause 9. The method of clause 8, wherein: the first channel length is equal to or less than 20 nanometers (nm), and the second channel length is equal to or greater than 30 nm.

Clause 10. The method of any of clauses 8 to 9, wherein: a difference between the first distance and the second distance is less than 5 nanometers (nm).

Clause 11. The method of any of clauses 8 to 10, further comprising: forming a plurality of mask patterns on an intermediate structure, the plurality of mask patterns including a first mask pattern, a second mask pattern, a third mask pattern, and a fourth mask pattern, wherein the intermediate structure includes: a stack of one or more gate/channel material layers on the substrate, and one or more hardmask layers on the stack; forming a capping film covering the third mask pattern and the fourth mask pattern without covering the first mask pattern and the second mask pattern, the capping film constituting spacers on sidewalls of the third mask pattern and the fourth mask pattern; patterning the one or more hardmask layers and the stack to become: a first slab on the substrate based on the first mask pattern, a second slab on the substrate based on the second mask pattern, a third slab on the substrate based on the third mask pattern and the corresponding spacers on the sidewalls of the third mask pattern, and a fourth slab on the substrate based on the fourth mask pattern and the corresponding spacers on the sidewalls of the fourth mask pattern; and forming the first gate structure, the second gate structure, the third gate structure, and the fourth gate structure based on the first slab, the second slab, the third slab, and the fourth slab, respectively.

Clause 12. The method of clause 11, further comprising: forming a first source/drain structure between the first gate structure and the second gate structure, the first source/drain structure coupling to a first channel structure and a second channel structure; and forming a second source/drain structure between the third gate structure and the fourth gate structure, the second source/drain structure coupling to a third channel structure and a fourth channel structure.

Clause 13. The method of any of clauses 8 to 12, wherein the semiconductor structure comprises a gate-all-around structure.

Clause 14. The method of any of clauses 8 to 12, wherein the semiconductor structure comprises a FinFET structure.

Clause 15. The method of clause 12, further comprising: forming a first bottom dielectric structure prior to the forming the first source/drain structure, the first bottom dielectric structure being between the first source/drain structure and the substrate; and forming a second bottom dielectric structure prior to the forming the second source/drain structure, the second bottom dielectric structure being between the second source/drain structure and the substrate.

Clause 16. The method of any of clauses 12 to 15, wherein the forming the first source/drain structure and the forming the second source/drain structure comprises: epitaxially growing the first source/drain structure and the second source/drain structure.

Clause 17. The method of any of clauses 11, 12, 15, and 16, wherein the forming the capping film comprises: forming a layer of capping film material on the plurality of mask patterns; and removing a portion of the layer of capping film material that covers the first mask pattern and the second mask pattern.

Clause 18. The method of clause 17, wherein the layer of capping film material includes $SiO_2$.

Clause 19. The method of any of clauses 17 to 18, wherein the removing the portion of the layer of capping film material comprises: forming a block pattern over the third mask pattern and the fourth mask pattern without covering the first mask pattern and the second mask pattern; and performing a wet etching process using the block pattern as a mask to remove the portion of the layer of capping film material.

Clause 20. The method of any of clauses 11, 12, and 15 to 19, wherein: the one or more hardmask layers includes a first hardmask layer over a second hardmask layer, and the patterning the one or more hardmask layers and the stack comprises: patterning the first hardmask layer to become: a first hardmask pattern based on the first mask pattern, a second hardmask pattern based on the second mask pattern, a third hardmask pattern based on the third mask pattern and the corresponding spacers on the sidewalls of the third mask pattern, and a fourth hardmask pattern based on the fourth mask pattern and the corresponding spacers on the sidewalls of the fourth mask pattern; and patterning the second hardmask layer and the stack to become: the first slab based on the first hardmask pattern, the second slab based on the second hardmask pattern, the third slab based on the third hardmask pattern, and the fourth slab based on the fourth hardmask pattern.

Clause 21. The method of clause 20, wherein: the first hardmask layer includes amorphous silicon, $SiO_2$, amorphous carbon, or a combination thereof, and the second hardmask layer includes SiN.

Clause 22. The method of any of clauses 20 to 21, wherein the patterning the first hardmask layer comprises: performing a dry etching process using the first mask pattern, the second mask pattern, the third mask pattern and the corresponding spacers on the sidewalls of the third mask pattern, and the fourth mask pattern and the corresponding spacers on the sidewalls of the fourth mask pattern as masks.

Clause 23. The method of any of clauses 20 to 22, wherein the patterning the second hardmask layer and the stack comprises: performing a dry etching process using the first hardmask pattern, the second hardmask pattern, the third hardmask pattern, and the fourth hardmask pattern as masks.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A semiconductor structure, comprising:
   a first gate structure disposed on a substrate and having a first channel length along a first direction;
   a second gate structure disposed on the substrate and having the first channel length along the first direction, a first source/drain space above the substrate and between the first gate structure and the second gate structure having a first distance along the first direction;
   a third gate structure disposed on the substrate and having a second channel length along the first direction; and
   a fourth gate structure disposed on the substrate and having the second channel length along the first direction, a second source/drain space above the substrate and between the third gate structure and the fourth gate structure having a second distance along the first direction,
   wherein
      the second channel length is different from the first channel length, and
      the second distance ranges from 0.75 times to 1.25 times the first distance.

2. The semiconductor structure of claim 1, wherein:
   the first channel length is equal to or less than 20 nanometers (nm), and
   the second channel length is equal to or greater than 30 nm.

3. The semiconductor structure of claim 1, wherein:
   a difference between the first distance and the second distance is less than 5 nanometers (nm).

4. The semiconductor structure of claim 1, further comprising:
   a first channel structure;
   a second channel structure;
   a first source/drain structure disposed between the first gate structure and the second gate structure, the first source/drain structure coupling to the first channel structure and the second channel structure;
   a third channel structure;
   a fourth channel structure; and
   a second source/drain structure disposed between the third gate structure and the fourth gate structure, the second source/drain structure coupling to the third channel structure and the fourth channel structure.

5. The semiconductor structure of claim 1, wherein the semiconductor structure comprises a gate-all-around structure.

6. The semiconductor structure of claim 1, wherein the semiconductor structure comprises a FinFET structure.

7. The semiconductor structure of claim 4, further comprising:
   a first bottom dielectric structure between the first source/drain structure and the substrate, and
   a second bottom dielectric structure between the second source/drain structure and the substrate.

8. A method of manufacturing a semiconductor structure, comprising:
   forming a first gate structure disposed on a substrate and having a first channel length along a first direction;
   forming a second gate structure disposed on the substrate and having the first channel length along the first direction, a first source/drain space above the substrate and between the first gate structure and the second gate structure having a first distance along the first direction;
   forming a third gate structure disposed on the substrate and having a second channel length along the first direction; and
   forming a fourth gate structure disposed on the substrate and having the second channel length along the first direction, a second source/drain space above the substrate and between the third gate structure and the fourth gate structure having a second distance along the first direction,
   wherein
      the second channel length is different from the first channel length, and
      the second distance ranges from 0.75 times to 1.25 times the first distance.

9. The method of claim 8, wherein:
   the first channel length is equal to or less than 20 nanometers (nm), and
   the second channel length is equal to or greater than 30 nm.

10. The method of claim 8, wherein:
    a difference between the first distance and the second distance is less than 5 nanometers (nm).

11. A method of manufacturing a semiconductor structure, comprising:
    forming a first gate structure disposed on a substrate and having a first channel length along a first direction;
    forming a second gate structure disposed on the substrate and having the first channel length along the first direction, a first source/drain space between the first gate structure and the second gate structure having a first distance along the first direction;

forming a third gate structure disposed on the substrate and having a second channel length along the first direction;

forming a fourth gate structure disposed on the substrate and having the second channel length along the first direction, a second source/drain space between the third gate structure and the fourth gate structure having a second distance along the first direction, wherein the second channel length is different from the first channel length, and the second distance ranges from 0.75 times to 1.25 times the first distance;

forming a plurality of mask patterns on an intermediate structure, the plurality of mask patterns including a first mask pattern, a second mask pattern, a third mask pattern, and a fourth mask pattern, wherein the intermediate structure includes:

a stack of one or more gate/channel material layers on the substrate, and one or more hardmask layers on the stack;

forming a capping film covering the third mask pattern and the fourth mask pattern without covering the first mask pattern and the second mask pattern, the capping film constituting spacers on sidewalls of the third mask pattern and the fourth mask pattern;

patterning the one or more hardmask layers and the stack to become:

a first slab on the substrate based on the first mask pattern, a second slab on the substrate based on the second mask pattern, a third slab on the substrate based on the third mask pattern and the corresponding spacers on the sidewalls of the third mask pattern, and a fourth slab on the substrate based on the fourth mask pattern and the corresponding spacers on the sidewalls of the fourth mask pattern; and forming the first gate structure, the second gate structure, the third gate structure, and the fourth gate structure based on the first slab, the second slab, the third slab, and the fourth slab, respectively.

12. The method of claim 11, further comprising:

forming a first source/drain structure between the first gate structure and the second gate structure, the first source/drain structure coupling to a first channel structure and a second channel structure; and forming a second source/drain structure between the third gate structure and the fourth gate structure, the second source/drain structure coupling to a third channel structure and a fourth channel structure.

13. The method of claim 8, wherein the semiconductor structure comprises a gate-all-around structure.

14. The method of claim 8, wherein the semiconductor structure comprises a FinFET structure.

15. The method of claim 12, further comprising:

forming a first bottom dielectric structure prior to the forming the first source/drain structure, the first bottom dielectric structure being between the first source/drain structure and the substrate; and forming a second bottom dielectric structure prior to the forming the second source/drain structure, the second bottom dielectric structure being between the second source/drain structure and the substrate.

16. The method of claim 12, wherein the forming the first source/drain structure and the forming the second source/drain structure comprises:

epitaxially growing the first source/drain structure and the second source/drain structure.

17. The method of claim 11, wherein the forming the capping film comprises:

forming a layer of capping film material on the plurality of mask patterns; and removing a portion of the layer of capping film material that covers the first mask pattern and the second mask pattern.

18. The method of claim 17, wherein the layer of capping film material includes $SiO_2$.

19. The method of claim 17, wherein the removing the portion of the layer of capping film material comprises:

forming a block pattern over the third mask pattern and the fourth mask pattern without covering the first mask pattern and the second mask pattern; and performing a wet etching process using the block pattern as a mask to remove the portion of the layer of capping film material.

20. The method of claim 11, wherein:

the one or more hardmask layers includes a first hardmask layer over a second hardmask layer, and the patterning the one or more hardmask layers and the stack comprises:

patterning the first hardmask layer to become:

a first hardmask pattern based on the first mask pattern, a second hardmask pattern based on the second mask pattern, a third hardmask pattern based on the third mask pattern and the corresponding spacers on the sidewalls of the third mask pattern, and a fourth hardmask pattern based on the fourth mask pattern and the corresponding spacers on the sidewalls of the fourth mask pattern; and patterning the second hardmask layer and the stack to become:

the first slab based on the first hardmask pattern, the second slab based on the second hardmask pattern, the third slab based on the third hardmask pattern, and the fourth slab based on the fourth hardmask pattern.

21. The method of claim 20, wherein:

the first hardmask layer includes amorphous silicon, $SiO_2$, amorphous carbon, or a combination thereof, and the second hardmask layer includes SiN.

22. The method of claim 20, wherein the patterning the first hardmask layer comprises:

performing a dry etching process using the first mask pattern, the second mask pattern, the third mask pattern and the corresponding spacers on the sidewalls of the third mask pattern, and the fourth mask pattern and the corresponding spacers on the sidewalls of the fourth mask pattern as masks.

23. The method of claim 20, wherein the patterning the second hardmask layer and the stack comprises:

performing a dry etching process using the first hardmask pattern, the second hardmask pattern, the third hardmask pattern, and the fourth hardmask pattern as masks.

* * * * *